US009412776B2

(12) United States Patent
Kawashima et al.

(10) Patent No.: US 9,412,776 B2
(45) Date of Patent: Aug. 9, 2016

(54) SOLID-STATE IMAGING DEVICE AND METHOD OF MANUFACTURING THE SAME, AND IMAGING APPARATUS

(71) Applicant: Sony Corporation, Tokyo (JP)

(72) Inventors: Atsushi Kawashima, Kumamoto (JP); Katsunori Hiramatsu, Kumamoto (JP); Yasufumi Miyoshi, Kumamoto (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 14/934,692

(22) Filed: Nov. 6, 2015

(65) Prior Publication Data

US 2016/0064437 A1 Mar. 3, 2016

Related U.S. Application Data

(63) Continuation of application No. 14/630,871, filed on Feb. 25, 2015, now abandoned, which is a continuation of application No. 14/278,548, filed on May 15, 2014, now Pat. No. 9,024,249, which is a continuation of application No. 13/137,093, filed on Jul. 20, 2011, now Pat. No. 8,766,156.

(30) Foreign Application Priority Data

Jul. 29, 2010 (JP) ................................ 2010-169911

(51) Int. Cl.
*H01L 27/00* (2006.01)
*H01L 27/146* (2006.01)

(52) U.S. Cl.
CPC ...... *H01L 27/14623* (2013.01); *H01L 27/1463* (2013.01); *H01L 27/1464* (2013.01);

(Continued)

(58) Field of Classification Search
CPC ........... H01L 27/146; H01L 27/14623; H01L 27/14636; H01L 27/14685
USPC ........... 250/208.1, 214.1; 257/461, E31.122, 257/E31.127, 432; 348/294, 299, 308
See application file for complete search history.

(56) References Cited

U.S. PATENT DOCUMENTS 5,214,272 A 5/1993 Ueno
6,046,487 A * 4/2000 Benedict ........... H01L 21/76232 257/510

(Continued)

FOREIGN PATENT DOCUMENTS

| | | | |
|---|---|---|---|
| CN | 101079967 | A | 11/2007 |
| CN | 101471369 | A | 7/2009 |
| JP | 2004-140152 | | 5/2004 |

OTHER PUBLICATIONS

Chinese Office Action issued Dec. 29, 2015 for corresponding Chinese Application No. 201110206040.8.

*Primary Examiner* — Kevin Pyo
(74) *Attorney, Agent, or Firm* — Wolf, Greenfield & Sacks, P.C.

(57) ABSTRACT

A solid-state imaging device includes: a semiconductor substrate provided with an effective pixel region including a light receiving section that photoelectrically converts incident light; an interconnection layer that is provided at a plane side opposite to the light receiving plane of the semiconductor substrate; a first groove portion that is provided between adjacent light receiving sections and is formed at a predetermined depth from the light receiving plane side of the semiconductor substrate; and an insulating material that is embedded in at least a part of the first groove portion.

30 Claims, 21 Drawing Sheets

64
65
63
62
63
61
61
22
23B
23A

(52) U.S. Cl.
CPC .... *H01L27/14621* (2013.01); *H01L 27/14627* (2013.01); *H01L 27/14636* (2013.01); *H01L 27/14645* (2013.01); *H01L 27/14685* (2013.01)

(56) References Cited

U.S. PATENT DOCUMENTS

| | | | |
|---|---|---|---|
| 7,741,660 | B2 | 6/2010 | Mouli |
| 8,766,156 | B2 | 7/2014 | Kawashima et al. |
| 9,024,249 | B2 | 5/2015 | Kawashima et al. |
| 2006/0060899 | A1 | 3/2006 | Hong et al. |
| 2007/0170541 | A1 * | 7/2007 | Chui ................. H01L 21/28255 257/506 |
| 2009/0166783 | A1 | 7/2009 | Maruyama |
| 2010/0176475 | A1 | 7/2010 | Sano et al. |
| 2010/0201834 | A1 | 8/2010 | Watanabe et al. |
| 2012/0025059 | A1 | 2/2012 | Kawashima et al. |
| 2014/0246565 | A1 | 9/2014 | Kawashima et al. |
| 2015/0171123 | A1 | 6/2015 | Kawashima et al. |

* cited by examiner

SOLID-STATE IMAGING DEVICE AND METHOD OF MANUFACTURING THE SAME, AND IMAGING APPARATUS

CROSS REFERENCE TO RELATED APPLICATIONS

This is a Continuation Application of U.S. patent application Ser. No.: 14/630,871, filed Feb. 25, 2015, which is a Continuation Application of U.S patent application Ser. No.: 14/278,548, filed May 15, 2014, now U.S. Pat. No.: 9,024, 249, issued on May 5, 2015, which is a Continuation Application of U.S. patent application Ser. No.: 13/137,093, filed Jul. 20, 2011, now U.S. Pat. No.: 8,766,156, issued on Jul. 1, 2014, which in turn claims priority from Japanese Application No.: 2010-169911, filed on Jul. 29, 2010, the entire contents of each of which is incorporated herein by reference.

FIELD

The present disclosure relates to a solid-state imaging device and a method of manufacturing the same, and an imaging apparatus, and more particularly, to a rear-surface irradiation type solid-state imaging device and a method of manufacturing the same, and an imaging apparatus using such a solid-state imaging device.

BACKGROUND

In the related art, in video cameras, digital still cameras, or the like, solid-state imaging devices including a CCD (Charge Coupled Device) or a CMOS image sensor are widely used. In these solid-state imaging devices, alight receiving section including photodiode is provided for each pixel, and in the light receiving section, incident light is photoelectrically converted and thereby a signal charge is generated.

In a CCD-type solid-state imaging device, the signal charge generated in the light receiving section is transferred to a charge transferring section having a CCD structure, and is converted into a pixel signal in an output section and then is output. On the other hand, in a CMOS-type solid-state imaging devices, the signal charge generated in the light receiving section is amplified for each pixel, and the amplified signal is output as a pixel signal by a signal line.

In such a solid-state imaging device, there is a problem in that aliasing occurs inside a semiconductor substrate due to inclined incident light or incident light that is diffusely reflected at an upper portion of the light receiving section, and thereby optical noise such as smearing and flaring occurs.

Therefore, in JP-A-2004-140152, in regard to the CCD-type solid-state imaging device, there is disclosed a technology for suppressing the occurrence of smearing by forming a light shielding film provided at an upper portion of the charge transferring section in a manner to be embedded in a groove portion formed in the interface of the light receiving section and a read-out gate section. However, in the technology disclosed in JP-A-2004-140152, since the light shielding film is formed in the groove portion formed by using a LOCOS oxide film, it is difficult to form the light shielding film at a deep portion of the substrate, and thereby it is difficult to reliably prevent the inclined incident light, which is a cause of smearing, from being incident. In addition, since the pixel area is diminished in proportion to the embedding depth of the light shielding film, it is basically difficult to deeply embed the light shielding film.

However, in recent years, accompanying the miniaturization and lowering of power consumption of a video camera or a digital still camera, and a mobile phone with camera, the CMOS-type solid-state imaging device is frequently used. In addition, as the CMOS-type solid-state imaging device, a front-surface irradiation type shown in FIG. 24 and a rear-surface irradiation type shown in FIG. 25 are known.

As shown in a schematic configuration diagram of FIG. 24, a front-surface irradiation type solid-state imaging device 111 is configured to have a pixel region 113 in which a plurality of unit pixels 116 including a photodiode PD serving as a photoelectric conversion section and a plurality of pixel transistors is formed in a semiconductor substrate 112. Although the pixel transistor is not shown, a gate electrode 114 is shown in FIG. 24 and this indicates schematically the presence of the pixel transistor.

Each photodiode PD is separated by a device separating region 115 composed of an impurity diffused layer, and a multi-layered interconnection layer 119 where a plurality of interconnections 118 are disposed via an interlayer insulating film 117 are formed on a front-surface side of the semiconductor substrate 112 where the pixel transistor is formed. The interconnection 118 is formed except for a portion corresponding to the location of the photodiode PD.

An on-chip color filter 121 and an on-chip microlens 122 are sequentially formed on the multi-layered interconnection layer 119 via a planarized film 120. The on-chip color filter 121 is configured by arranging each color filter of, for example, red (R), green (G), and blue (B).

In the front-surface irradiation type solid-state imaging device 111, a front surface of a substrate where the multi-layered interconnection layer 119 is formed is set as a light receiving plane 123, and light L is incident from the front surface side of the substrate.

On the other hand, as shown in a schematic configuration diagram of FIG. 25, a rear-surface irradiation type solid-state imaging device 131 is configured to have the pixel region 113 in which a plurality of unit pixels 116 including a photodiode PD serving as a photoelectric conversion section and a plurality of pixel transistors are formed in the semiconductor substrate 112. Although not shown, the pixel transistor is formed in the substrate front-surface side, and the gate electrode 114 is shown in FIG. 25 and this indicates schematically the presence of the pixel transistor.

Each photodiode PD is separated by the device separating region 115 composed of an impurity diffused layer, and the multi-layered interconnection layer 119 where a plurality of interconnections 118 are disposed via the interlayer insulating film 117 is formed on a front-surface side of the semiconductor substrate 112 where the pixel transistor is formed. In the rear-surface irradiation type, the interconnection 118 may be formed regardless of the position of the photodiode PD.

In addition, on a rear surface that the photodiode PD of the semiconductor substrate 112 faces, an insulating layer 128, the on-chip color filter 121, and on-chip microlens 122 are sequentially formed.

In the rear-surface irradiation type solid-state imaging device 131, the rear surface of the substrate, which is opposite to the substrate front-surface side where the multi-layered interconnection layer and the pixel transistor are formed, is set as a light receiving plane 132, and light L may be incident from the rear surface-side of the substrate.

Increasing integration of a device through the miniaturization of the pixels has been demanded. However, the front-surface irradiation type solid-state imaging device 111 has a configuration where the light L is received by the photodiode PD through the multi-layered interconnection layer 119. Therefore, accompanying the progress of increasing integration and the miniaturization of the pixels, there is a problem in that it is difficult to sufficiently secure a light receiving section region due to an obstacle such as the interconnection, and thereby sensitivity is decreased or shading increases.

On the other hand, in the rear-surface irradiation type solid-state imaging device 131, the light L can be incident to the photodiode PD without being subjected to a restriction due to the multi-layered interconnection layer 119, such that it is possible to broaden the opening of the photodiode PD and thereby it is possible to realize increased sensitivity.

SUMMARY

Even in the case of the rear-surface irradiation type solid-state imaging device, the optical noise caused by the inclined light is of concern, such that it is preferable that a light shielding film be formed between the rear surface side of the substrate that serves as a light irradiation side and the light receiving section. In this case, it may be considered that a single layer having the light shielding film is formed in the rear surface side of the substrate that serves as the light irradiation side, but the distance between the substrate and the on-chip lens plane becomes long in proportion to the height of the light shielding film, such that the deterioration in focusing characteristics is caused. In addition, in a case where focusing characteristics are deteriorated, inclined light transmitting a color filter of another pixel is incident to a light receiving section of a pixel different from the above-described pixel, and thereby there is a problem in that a color mixture or a decrease in sensitivity occurs.

Thus, it is desirable to provide a solid-state imaging device and a method of manufacturing the same, and an imaging apparatus, which is capable of suppressing optical noise such as flaring and smearing while not deteriorating the focusing characteristics.

According to an embodiment of the present disclosure, there is provided a solid-state imaging device including a semiconductor substrate provided with an effective pixel region including a light receiving section that photoelectrically converts incident light; an interconnection layer that is provided at a plane side opposite to the light receiving plane of the semiconductor substrate; a first groove portion that is provided between adjacent light receiving sections and is formed at a predetermined depth from the light receiving plane side of the semiconductor substrate; and an insulating material that is embedded in at least a part of the first groove portion.

According to another embodiment of the present disclosure, there is provided a solid-state imaging device including a semiconductor substrate provided with an effective pixel region including a light receiving section that photoelectrically converts incident light; an interconnection layer that is provided at a plane side opposite to the light receiving plane of the semiconductor substrate; a first groove portion that is provided between adjacent light receiving sections and is formed at a predetermined depth from the light receiving plane side of the semiconductor substrate; a second groove portion that is provided in an optical black region located at the periphery of the effective pixel region and optically shielded, and that is formed at a predetermined depth from the light receiving plane side of the semiconductor substrate; an insulating material that is embedded in at least a part of the first groove portion; and a light shielding material that is embedded in at least a part of the second groove portion.

According to still another embodiment of the present disclosure, there is provided a solid-state imaging device including a semiconductor substrate provided with an effective pixel region including a light receiving section that photoelectrically converts incident light; an interconnection layer that is provided at a plane side opposite to the light receiving plane of the semiconductor substrate; a first groove portion that is provided between adjacent light receiving sections and is formed at a predetermined depth from the light receiving plane side of the semiconductor substrate; a third groove portion that is provided between the effective pixel region and an optical black region located at the periphery of the effective pixel region and optically shielded, and that is formed at a predetermined depth from the light receiving plane side of the semiconductor substrate; an insulating material that is embedded in at least a part of the first groove portion; and a light shielding material that is embedded in at least a part of the third groove portion.

According to yet another embodiment of the present disclosure, there is provided a solid-state imaging device including a semiconductor substrate provided with an effective pixel region including a light receiving section that photoelectrically converts incident light; an interconnection layer that is provided at a plane side opposite to the light receiving plane of the semiconductor substrate; a first groove portion that is provided between adjacent light receiving sections and is formed at a predetermined depth from the light receiving plane side of the semiconductor substrate; a second groove portion that is provided in an optical black region located at the periphery of the effective pixel region and optically shielded, and that is formed at a predetermined depth from the light receiving plane side of the semiconductor substrate; a third groove portion that is provided between the effective pixel region and the optical black region and is formed at a predetermined depth from the light receiving plane side of the semiconductor substrate; an insulating material that is embedded in at least a part of the first groove portion; and a light shielding material that is embedded in at least a part of the second groove portion and at least a part of the third groove portion.

Here, the first groove portion that is provided between adjacent light receiving sections and is formed at a predetermined depth from the light receiving plane side of the semiconductor substrate; and the insulating material that is embedded in at least a part of the first groove portion are included, such that the light receiving sections are physically separated from each other and thereby it is possible to prevent a signal charge, which is photoelectrically converted at a vicinity of a front surface of the semiconductor substrate, from flowing to adjacent pixels.

In addition, a second groove portion that is provided in an optical black region located at the periphery of the effective pixel region and optically shielded, and that is formed at a predetermined depth from the light receiving plane side of the semiconductor substrate; and the light shielding material that is embedded in at least a part of the second groove portion are included, such that the embedded light-shielding of the optical black region is realized, and thereby the height of the solid-state imaging device can be further lowered.

In addition, the third groove portion that is provided between the effective pixel region and an optical black region and optically shielded, and that is formed at a predetermined depth from the light receiving plane side of the semiconductor substrate; and the light shielding material that is embedded in at least a part of the third groove portion, such that it is possible to suppress the sneaking of the light to the optical black region, and thereby improvement in the accuracy of the black level is realized.

According to still yet another embodiment of the present disclosure, there is provided a method of manufacturing a solid-state imaging device. The method includes forming a first groove portion having a predetermined depth from the light receiving plane side of a semiconductor substrate between adjacent light receiving sections of the semiconductor substrate provided with an effective pixel region including each of the light receiving sections that photoelectrically convert incident light; embedding an insulating material in at least a part of the first groove portion; and forming an interconnection layer at a plane side opposite to the light receiving plane of the semiconductor substrate.

According to further another embodiment of the present disclosure, there is provided a method of manufacturing a solid-state imaging device. The method includes forming a first groove portion having a predetermined depth from the light receiving plane side of a semiconductor substrate between adjacent light receiving sections of the semiconductor substrate provided with an effective pixel region including each of the light receiving sections that photoelectrically convert incident light; forming a second groove portion having a predetermined depth from the light receiving plane side of the semiconductor substrate in an optical black region that is located at the periphery of the effective pixel region and is optically shielded, in addition to forming the first groove portion; embedding an insulating material in at least a part of the first groove portion; embedding a light shielding material in at least a part of the second groove portion; and forming an interconnection layer at a plane side opposite to the light receiving plane of the semiconductor substrate.

According to still further another embodiment of the present disclosure, there is provided a method of manufacturing a solid-state imaging device. The method includes forming a first groove portion having a predetermined depth from the light receiving plane side of a semiconductor substrate between adjacent light receiving sections of the semiconductor substrate provided with an effective pixel region including each of the light receiving sections that photoelectrically convert incident light; forming a third groove portion having a predetermined depth from the light receiving plane side of the semiconductor substrate between the effective pixel region and an optical black region that is located at the periphery of the effective pixel region and is optically shielded, in addition to forming the first groove portion; embedding an insulating material in at least a part of the first groove portion; embedding a light shielding material in at least a part of the third groove portion; and forming an interconnection layer at a plane side opposite to the light receiving plane of the semiconductor substrate.

According to yet further another embodiment of the present disclosure, there is provided a method of manufacturing a solid-state imaging device. The method includes forming a first groove portion having a predetermined depth from the light receiving plane side of a semiconductor substrate between adjacent light receiving sections of the semiconductor substrate provided with an effective pixel region including each of the light receiving sections that photoelectrically convert incident light; forming a second groove portion having a predetermined depth from the light receiving plane side of the semiconductor substrate in an optical black region that is located at the periphery of the effective pixel region and is optically shielded, and forming a third groove portion having a predetermined depth from the light receiving plane side of the semiconductor substrate between the effective pixel region and the optical black region, in addition to forming the first groove portion; embedding an insulating material in at least a part of the first groove portion; embedding a light shielding material in at least a part of the second groove portion and at least a part of the third groove portion; and forming an interconnection layer at a plane side opposite to the light receiving plane of the semiconductor substrate.

Here, the first groove portion having a predetermined depth from the light receiving plane side of a semiconductor substrate between adjacent light receiving sections of the semiconductor substrate provided with an effective pixel region including each of the light receiving sections that photoelectrically convert incident light is formed, and then the insulating material is embedded in at least a part of the first groove portion. As a result thereof, the first groove portion that is provided between the adjacent light receiving sections and that is formed at a predetermined depth from the light receiving plane side of a semiconductor substrate, and the insulating material that is embedded in at least a part of the first groove portion are included. Therefore, the light receiving sections are physically separated from each other and thereby it is possible to prevent a signal charge, which is photoelectrically converted at a vicinity of a front surface of the semiconductor substrate, from flowing to adjacent pixels.

In addition, the second groove portion having a predetermined depth from the light receiving plane side of the semiconductor substrate is formed in the optical black region that is located at the periphery of the effective pixel region and is optically shielded, and then the insulating material is embedded in at least a part of the second groove portion. As a result thereof, the second groove portion that is provided in the optical black region located at the periphery of the effective pixel region and optically shielded, and that is formed at a predetermined depth from the light receiving plane side of the semiconductor substrate, and the light shielding material that is embedded in at least apart of the second groove portion are included. Therefore, the embedded light-shielding of the optical black region is realized, and thereby the height of the solid-state imaging device can be further lowered.

In addition, the third groove portion having a predetermined depth from the light receiving plane side of the semiconductor substrate is formed between the effective pixel region and the optical black region that is located at the periphery of the effective pixel region and is optically shielded, and then the light shielding material is embedded in at least a part of the third groove portion. As a result thereof, the third groove portion that is provided between the effective pixel region and the optical black region and that is formed at a predetermined depth from the light receiving plane side of the semiconductor substrate, and the light shielding material that is embedded in at least a part of the third groove portion are included. Therefore, it is possible to suppress the sneaking of the light to the optical black region, and thereby an improvement in the accuracy of the black level is realized.

According to still yet further another embodiment of the present disclosure, there is provided an imaging apparatus including a solid-state imaging device including a semiconductor substrate provided with an effective pixel region having a light receiving section that photoelectrically converts incident light, an interconnection layer that is provided at a plane side opposite to the light receiving plane of the semiconductor substrate, a first groove portion that is provided between adjacent light receiving sections and is formed at a predetermined depth from the light receiving plane side of the semiconductor substrate, and an insulating material that is embedded in at least a part of the first groove portion; an optical system that focuses incident light onto the light receiving section; and a signal processing section that processes a signal charge that is photoelectrically converted in the light receiving section.

According to furthermore another embodiment of the present disclosure, there is provided an imaging apparatus including a solid-state imaging device including a semiconductor substrate provided with an effective pixel region having a light receiving section that photoelectrically converts incident light, an interconnection layer that is provided at a plane side opposite to the light receiving plane of the semiconductor substrate, a first groove portion that is provided between adjacent light receiving sections and is formed at a predetermined depth from the light receiving plane side of the semiconductor substrate, a second groove portion that is provided in an optical black region located at the periphery of the effective pixel region and optically shielded and that is formed at a predetermined depth from the light receiving plane side of the semiconductor substrate, an insulating material that is embedded in at least a part of the first groove portion, and a light shielding material that is embedded in at least a part of the second groove portion; an optical system that focuses incident light onto the light receiving section; and a signal processing section that processes a signal charge that is photoelectrically converted in the light receiving section.

According to a further embodiment of the present disclosure, there is provided an imaging apparatus including a solid-state imaging device including a semiconductor substrate provided with an effective pixel region having a light receiving section that photoelectrically converts incident light, an interconnection layer that is provided at a plane side opposite to the light receiving plane of the semiconductor substrate, a first groove portion that is provided between adjacent light receiving sections and is formed at a predetermined depth from the light receiving plane side of the semiconductor substrate, a third groove portion that is provided between the effective pixel region and an optical black region located at the periphery of the effective pixel region and optically shielded, and that is formed at a predetermined depth from the light receiving plane side of the semiconductor substrate, an insulating material that is embedded in at least a part of the first groove portion, and a light shielding material that is embedded in at least a part of the third groove portion; an optical system that focuses incident light onto the light receiving section; and a signal processing section that processes a signal charge that is photoelectrically converted in the light receiving section.

According to a still further embodiment of the present disclosure, there is provided an imaging apparatus including a solid-state imaging device including a semiconductor substrate provided with an effective pixel region having a light receiving section that photoelectrically converts incident light, an interconnection layer that is provided at a plane side opposite to the light receiving plane of the semiconductor substrate, a first groove portion that is provided between adjacent light receiving sections and is formed at a predetermined depth from the light receiving plane side of the semiconductor substrate, a second groove portion that is provided in an optical black region located at the periphery of the effective pixel region and optically shielded, and that is formed at a predetermined depth from the light receiving plane side of the semiconductor substrate, a third groove portion that is provided between the effective pixel region and the optical black region and is formed at a predetermined depth from the light receiving plane side of the semiconductor substrate, an insulating material that is embedded in at least a part of the first groove portion, and a light shielding material that is embedded in at least a part of the second groove portion and at least a part of the third groove portion; an optical system that focuses incident light onto the light receiving section; and a signal processing section that processes a signal charge that is photoelectrically converted in the light receiving section.

Here, the first groove portion that is provided between the adjacent light receiving sections and that is formed at a predetermined depth from the light receiving plane side of a semiconductor substrate, and the insulating material that is embedded in at least a part of the first groove portion are included. Therefore, the light receiving sections are physically separated from each other and it is possible to prevent a signal charge, which is photoelectrically converted at a vicinity of a front surface of the semiconductor substrate, from flowing to adjacent pixels, whereby it is possible to obtain a pickup image with a high quality.

In addition, the second groove portion that is provided in the optical black region located at the periphery of the effective pixel region and optically shielded, and that is formed at a predetermined depth from the light receiving plane side of the semiconductor substrate, and the light shielding material that is embedded in at least apart of the second groove portion are included. Therefore, the embedded light-shielding of the optical black region is realized, and thereby the height of the solid-state imaging apparatus can be further lowered.

In addition, the third groove portion that is provided between the effective pixel region and the optical black region and that is formed at a predetermined depth from the light receiving plane side of the semiconductor substrate, and the light shielding material that is embedded in at least a part of the third groove portion are included. Therefore, it is possible to suppress the sneaking of the light to the optical black region, and an improvement in the accuracy of the black level is realized, whereby it is possible to obtain a pickup image with a high image quality.

According to the solid-state imaging device and the method of manufacturing the same, and the imaging apparatus according to the embodiments of the present disclosure, it is possible to suppress optical noise such as flaring and smearing while not deteriorating the focusing characteristics.

DETAILED DESCRIPTION

Hereinafter, exemplary embodiments for carrying out the present disclosure (hereinafter, referred to as "embodiment") will be described. Description will be made in the following order.

1. Schematic Configurational Example of CMOS-Type Solid-State Imaging Device
2. First Embodiment
3. Second Embodiment
4. Third Embodiment
5. Fourth Embodiment
6. Fifth Embodiment
7. Modification <1. Schematic Configurational Example of CMOS-Type Solid-State Imaging Device>

Figure 1:
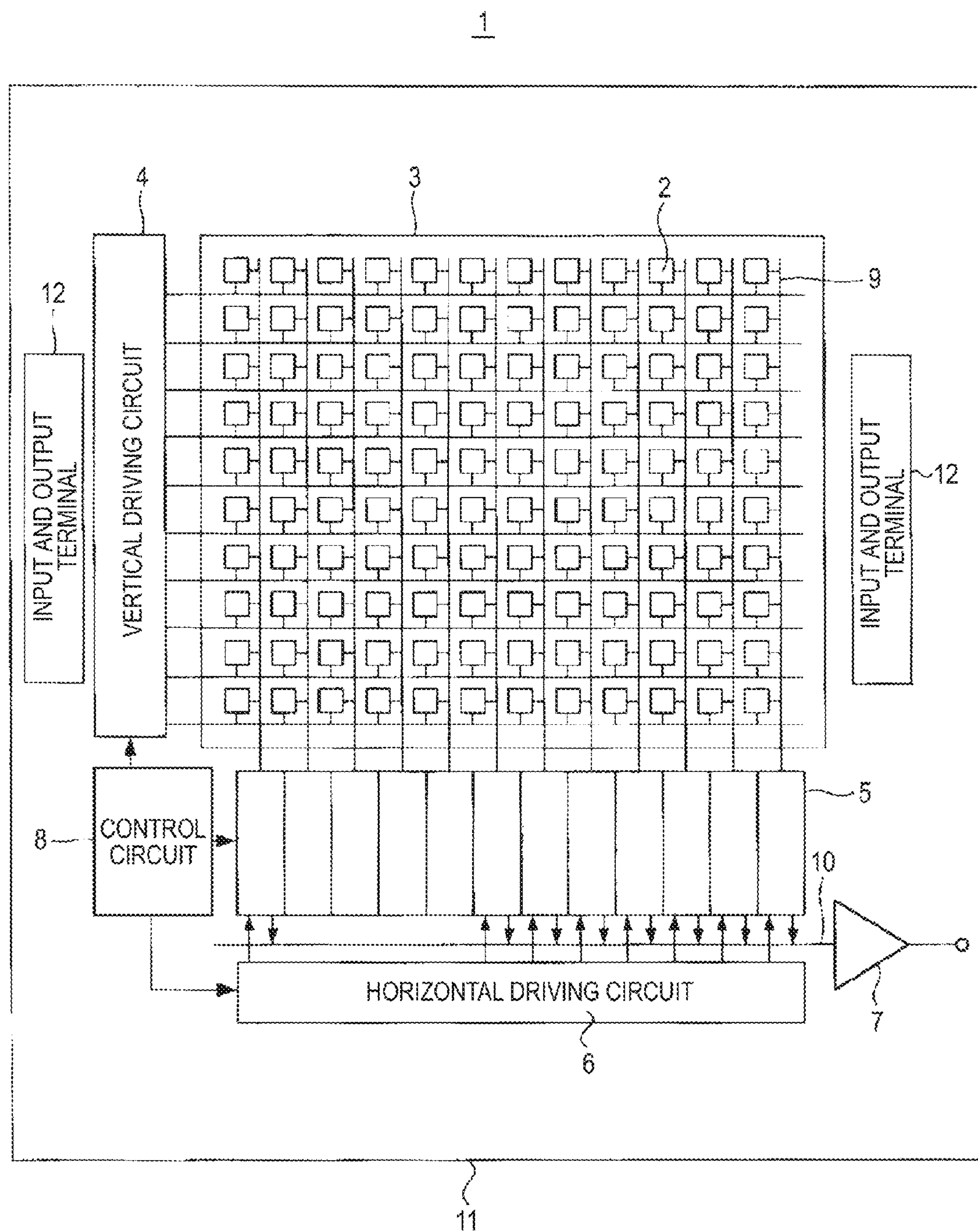
FIG. 1 is a schematic configuration diagram illustrating an example of a CMOS-type solid-state imaging device applied to each embodiment of the present disclosure.

FIG. 1 shows a schematic configuration diagram of an example of a CMOS-type solid-state imaging device applied to each embodiment of the present disclosure. Here, as shown in FIG. 1, a solid-state imaging device 1 includes a pixel region (so-called imaging region) 3 in which pixels 2 including a plurality of photoelectric conversion devices are two-dimensionally disposed in a semiconductor substrate 11 (for example, a silicon substrate) in a regular manner, and a peripheral circuit section.

Each of the pixels 2 includes for example, a photodiode serving as a photoelectric conversion device, and a plurality of pixel transistors (so-called MOS transistor). The plurality of pixel transistors may be composed of, for example, three transistors of a transfer transistor, a reset transistor, and an amplification transistor. In addition, a selection transistor may be added to be composed of four transistors.

Figure 23:
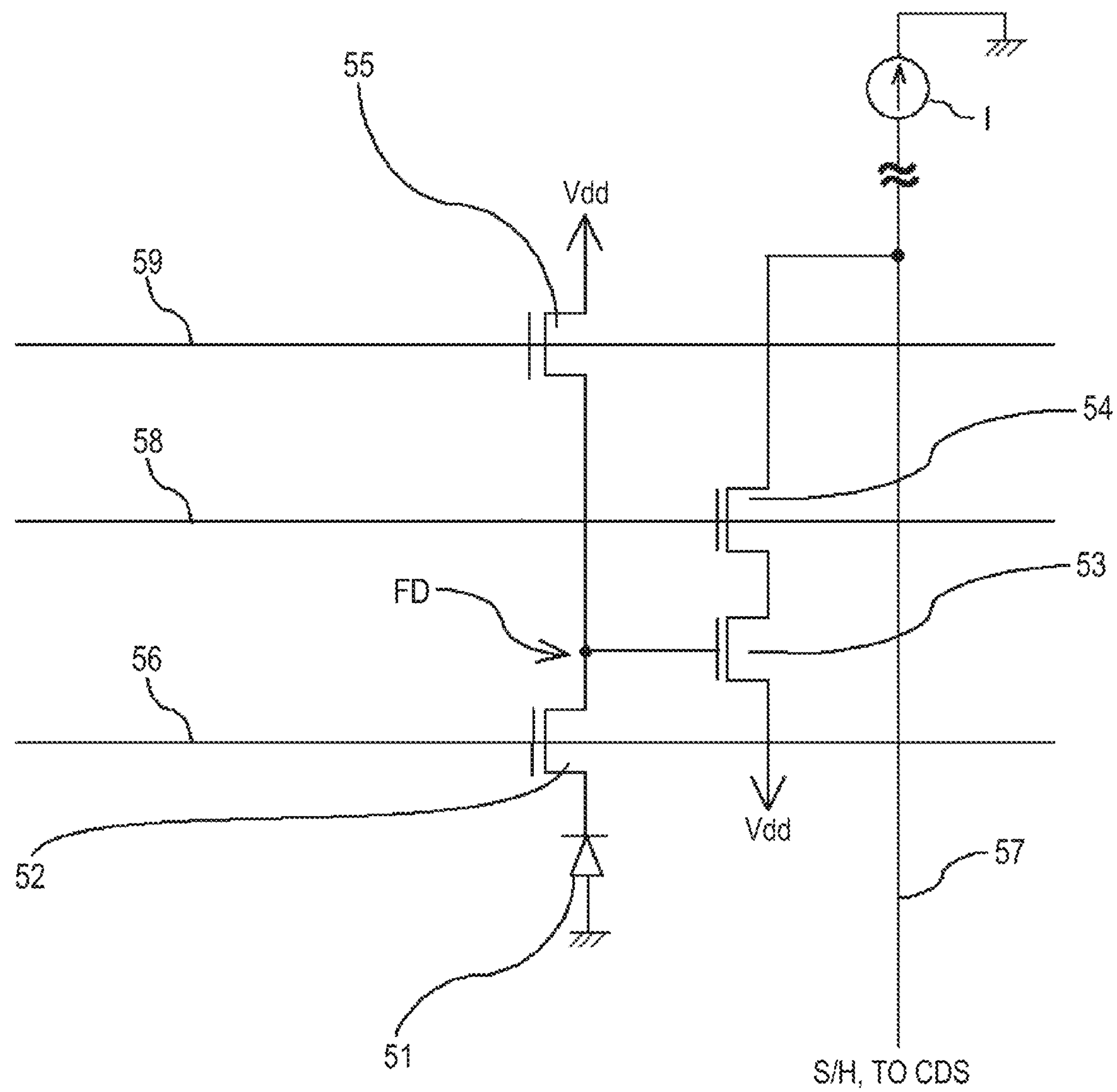
FIG. 23 is a schematic diagram illustrating an example of a circuit configuration of a unit pixel.
Figure 24:
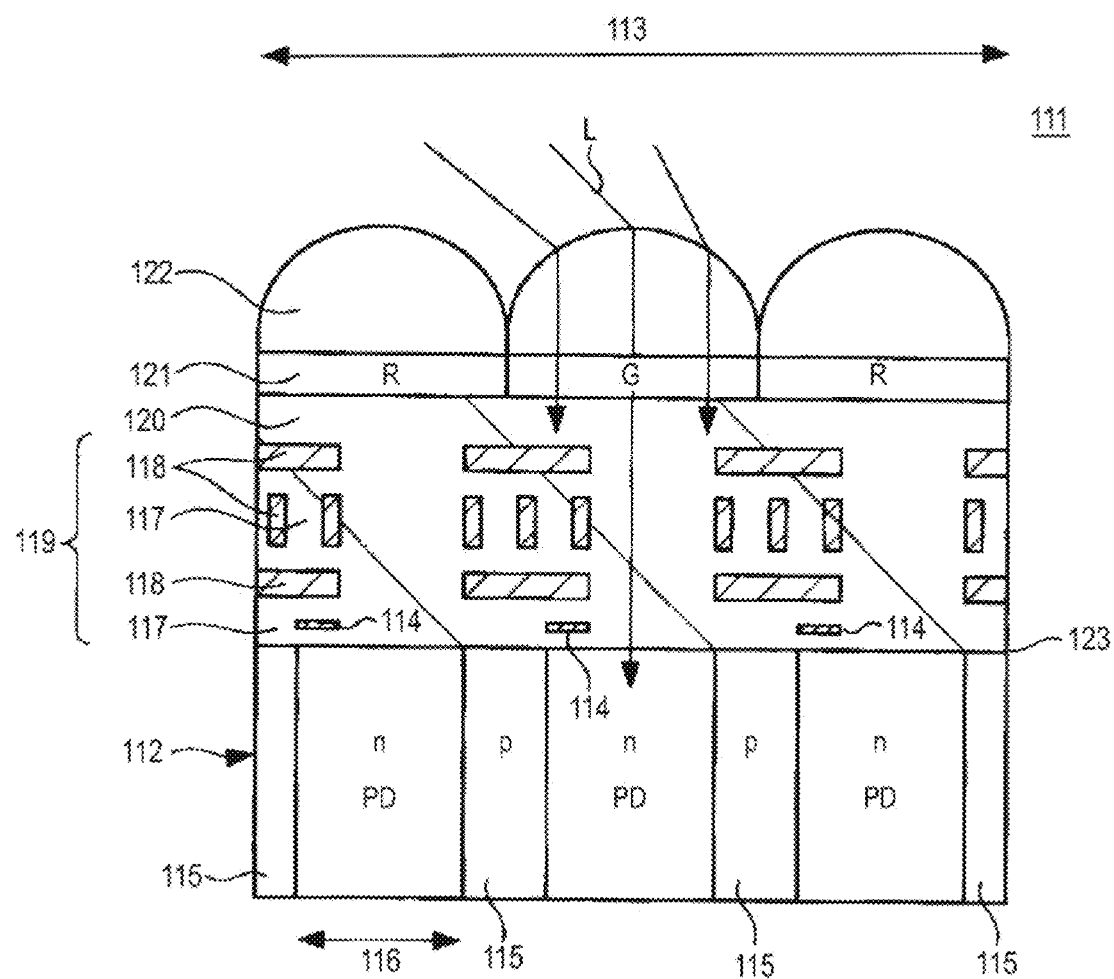
FIG. 24 is a schematic diagram illustrating a CMOS-type solid-state imaging device of a front-surface irradiation type in the related art.
Figure 25:
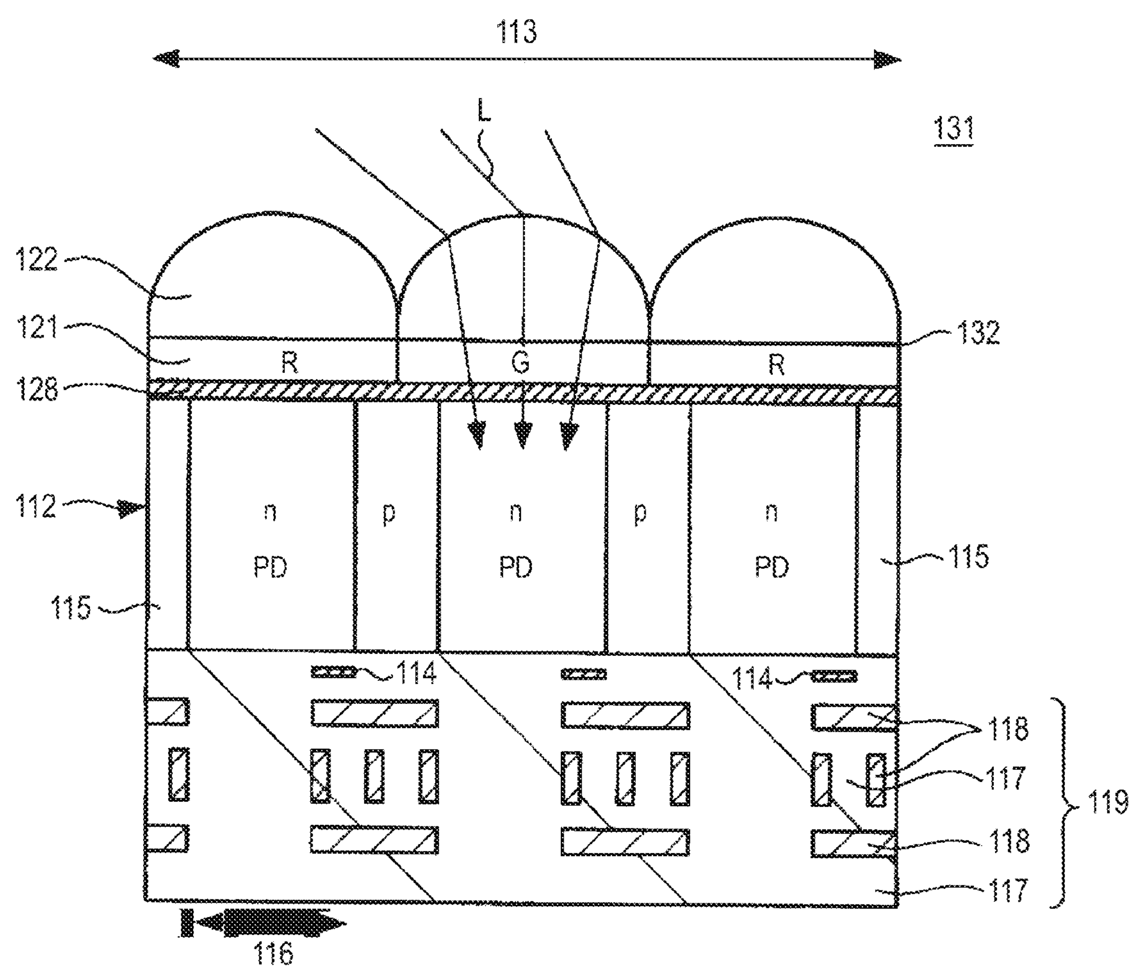
FIG. 25 is a schematic diagram illustrating a CMOS-type solid-state imaging device of a rear-surface irradiation type in the related art.

FIG. 23 shows a schematic diagram illustrating an example of a circuit configuration of two unit pixels of the pixel 2.

The unit pixel includes, for example, a photodiode 51 as the photoelectric conversion device, and includes four transistors of a transfer transistor 52, an amplification transistor 53, an address transistor 59, and a reset transistor 55 as active devices with respect to this one photodiode.

The photodiode 51 photoelectrically converts incident light to electric charges (here, electrons) with an amount corresponding to an amount of light. The transfer transistor 52 is connected between the photodiode 51 and a floating diffusion FD. In addition, a driving signal is applied to a gate (transfer gate) of transfer transistor via a driving interconnection 56, such that electrons, which are photoelectrically converted at the photodiode 51, are transferred to the floating diffusion FD.

A gate of the amplification transistor 53 is connected to the floating diffusion FD. The amplification transistor 53 is connected to a vertical signal line 57 via the address transistor 54, and makes up a source follower together with a constant current source I outside the pixel section. When an address signal is applied to a gate of the address transistor 54 via a driving interconnection 58 and the address transistor 54 is turned on, the amplification transistor 53 amplifies a potential of the floating diffusion FD and outputs a voltage corresponding to the potential to a vertical signal line 57. A voltage output from each pixel is output to an S/H.CDS circuit through the vertical signal line 57.

The reset transistor 55 is connected between a power source Vdd and the floating diffusion FD. A reset signal is applied to a gate of the reset transistor 55 via a driving interconnection 59, such that the potential of the floating diffusion FD is reset to the power source potential Vdd.

Since each gate of the transfer transistor 52, the address transistor 54, and the reset transistor 55 is connected in a row unit, the above-described operations are simultaneously performed with respect to each pixel for one row.

In addition, the pixel 2 may adopt a sharing pixel structure. This sharing pixel structure includes a plurality of photodiodes, a plurality of transfer transistors, one shared floating diffusion, and each sharing other pixel transistors one by one.

The peripheral circuit section includes a vertical driving circuit 4, column signal processing circuits 5, a horizontal driving circuit 6, an output circuit 7, a control circuit 8, or the like.

The control circuit 8 receives data for giving an instruction such as an input clock and an operation mode, or outputs data such as internal information of the solid-state imaging device. That is, the control circuit 8 generates a clock signal or a control signal that becomes a reference of an operation of the vertical driving circuit 4, the column signal processing circuits 5, the horizontal driving circuit 6, or the like, based on a vertical synchronization signal, a horizontal synchronization signal, and a master clock. In addition, these signals are input to the vertical driving circuit 4, the column signal processing circuits 5, the horizontal driving circuit 6, or the like.

The vertical driving circuit 4 includes, for example, a shift register, selects a pixel driving interconnection, supplies a pulse for driving a pixel to the selected pixel driving interconnection, and drives the pixel in a row unit. That is, the vertical driving circuit 9 selectively scans each pixel 2 of the pixel region 3 in a row unit sequentially in a vertical direction, and supplies a pixel signal to the column signal processing circuits 5 via a vertical signal line 9 based on a signal charge generated according to an amount of light received, for example, in the photodiode serving as an electric conversion device of each pixel 2.

The column signal processing circuits 5 are disposed, for example, for each column of the pixel 2, and perform a signal processing such as noise removal for each pixel column with respect to signals output from the pixels 2 of one row. That is, the column signal processing circuits 5 perform a signal processing such as a CDS for removing a fixed pattern noise unique to the pixel 2, signal amplification, and AD conversion. A horizontal selection switch (not shown) is connected and provided between output stages of the column signal processing circuits 5 and the horizontal signal line 10.

The horizontal driving circuit 6 includes, for example, a shift register and sequentially outputs a horizontal scanning pulse, and thereby selects in order each of column signal processing circuits 5 and outputs a pixel signal supplied from each of the column signal processing circuit 5 to the horizontal signal line 10.

The output circuit 7 performs a signal processing with respect to signals sequentially supplied from each of the column signal processing circuits 5 via the horizontal signal line 10, and outputs the processed signals. For example, only buffering may be performed, or black level adjustment, row variation correction, various digital signal processes, or the like may be performed. An input and output terminal 12 exchanges a signal with the outside.

Figure 2:
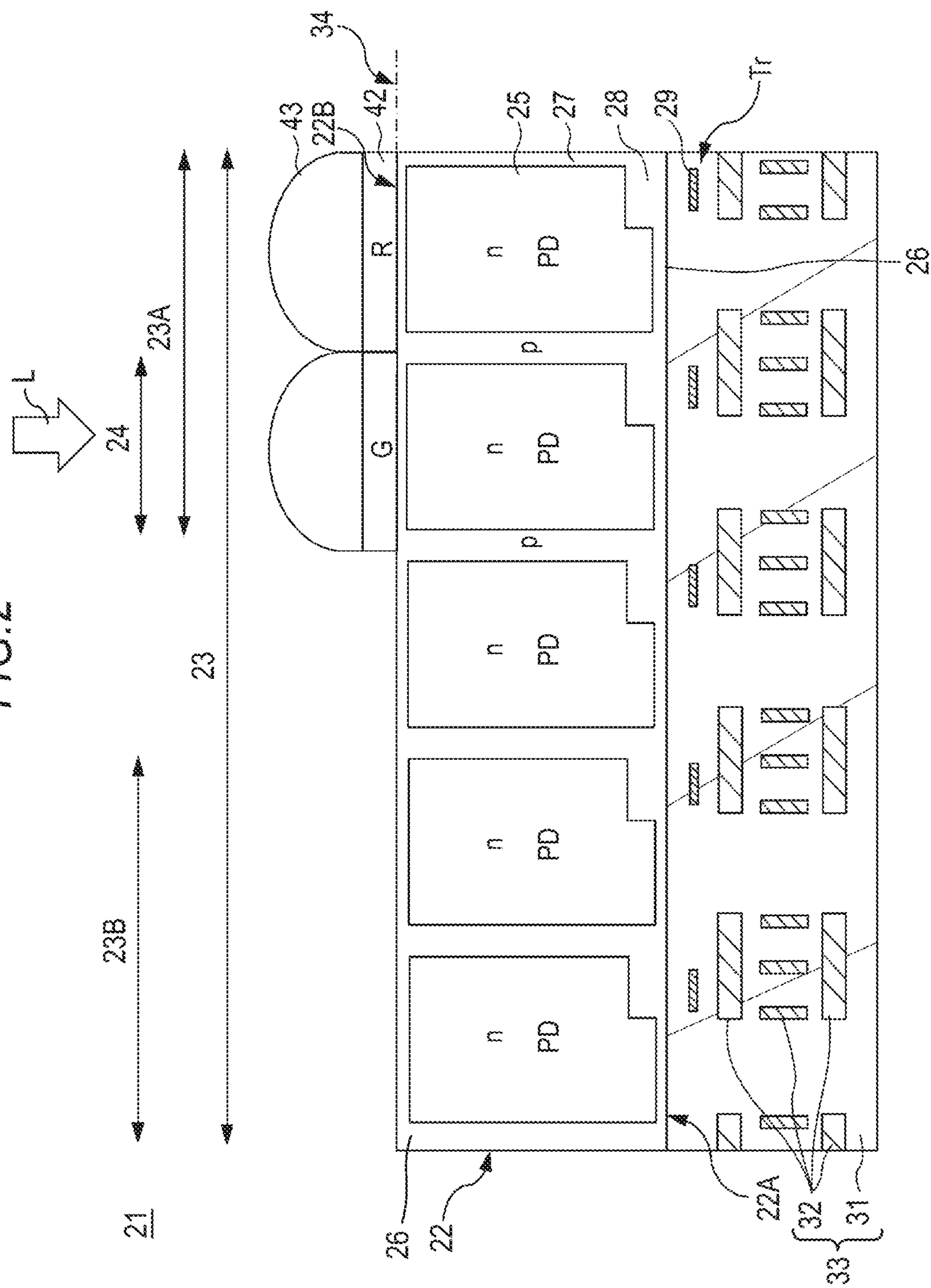
FIG. 2 is a schematic diagram illustrating a cross-sectional structure of an example of the CMOS-type solid-state imaging device applied to each embodiment of the present disclosure.

FIG. 2 a schematic diagram illustrating a cross-sectional structure of an example a CMOS-type solid-state imaging device applied to each embodiment of the present disclosure. A CMOS-type solid-state imaging device 21 shown in FIG. 2 includes, for example, a pixel region (so-called an imaging region) 23 where a plurality of pixels are arranged, and a peripheral circuit section that is disposed at the periphery of the pixel region (not shown in FIG. 2), which are formed in a semiconductor substrate 22 made of, for example, silicon.

The pixel region 23 includes an effective pixel region 23A that actually receives light, amplifies a signal charge generated by a photoelectric conversion, and reads out it by the column signal processing circuit 5, and an optical black region 23B for outputting an optical black that becomes a reference for the black level. In addition, the optical black region 23B is formed at an outer circumferential part of the effective pixel region 23A.

The unit pixel 24 includes a photodiode PD serving as a photoelectric conversion section and a plurality of pixel transistors Tr. The photodiode PD is formed across the entire region in the thickness direction of the semiconductor substrate 22, and is configured as a pn conjunction type photodiode by an n-type semiconductor region 25 and a p-type semiconductor region 26 facing the front and rear surfaces of the substrate. In addition, the p-type semiconductor region facing the front and rear surfaces of the substrate also functions as a hole charge accumulation region for suppressing a dark current.

Each pixel 24 including the photodiode PD and the pixel transistor Tr is separated by a device separating region 27 formed in the p-type semiconductor region. The pixel transistor Tr is configured by forming n-type source and drain regions (not shown) in p-type semiconductor well region 28 formed at a front-surface side 22A of the semiconductor substrate 22, and forming a gate electrode 29 on the front surface of the substrate between the n-type source and drain regions via a gate insulating film. In addition, in FIG. 2, a plurality of pixel transistors are represented by one pixel transistor Tr and are schematically shown by the gate electrode 29.

On the front surface 22A of the semiconductor substrate 22, so-called multi-layered interconnection layer 33 where a plurality of interconnections 32 are disposed via an interlayer insulating film 31 is formed. Light is not incident to the multi-layered interconnection layer 33, such that the layout of the interconnections 32 can be freely set.

In addition, on the rear surface 22B of the semiconductor substrate 22, an on-chip color filter 42 and an on-chip microlens 43 are sequentially formed. In addition, as the on-chip color filter 42, for example, a color filter of a Bayer array may be used, and the on-chip microlens 43 may be made of, for example, an organic material such as a resin.

In addition, light L is incident from the rear-surface 22B side of the substrate, and is focused at the on-chip microlens 43 and is received by each photodiode PD.

<2. First Embodiment>

[Configurational Example of Solid-State Imaging Device]

Figure 3:
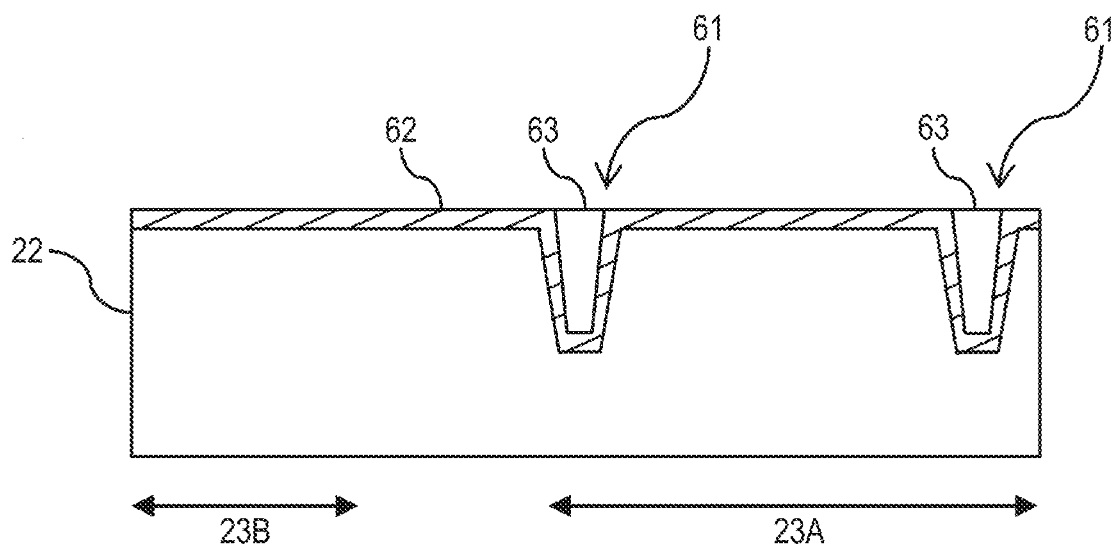
FIG. 3 is a schematic diagram illustrating a first embodiment of the solid-state imaging device according to the present disclosure.

FIG. 3 shows a schematic diagram illustrating a first embodiment of a solid-state imaging device according to the present disclosure. The solid-state imaging device according to this embodiment includes a first groove portion 61 that has a line width of 100 to 300 nm and that is formed in the device separating region 27 of the rear surface 22B side of the substrate, which serves as a light receiving plane 34 of the photodiode PD, from the rear-surface 22B side of the semiconductor substrate 22. In addition, the first groove portion 61 is formed in a lattice shape to surround each pixel 24 in a plan view.

In addition, a high-dielectric material film 62 made of a hafnium oxide ($HfO_2$) film is formed on the rear surface 22B of the semiconductor substrate 22, and the high-dielectric material film 62 is formed on a side surface and the bottom surface of the first groove portion 61. Furthermore, an insulating material 63 made of silicon dioxide is embedded in the first groove portion 61 via the high-dielectric material film 62.

In the rear-surface irradiation type solid-state imaging device 21 according to the first embodiment, adjacent light receiving sections are physically separated by the first groove portion 61. Therefore, it is possible to suppress a signal charge, which is photoelectrically converted at a vicinity of the rear surface of the semiconductor substrate 22, from flowing to adjacent pixels and it is possible to diminish an optical color mixture that may occur between the adjacent pixels.

In addition, in a case where the first groove portion 61 is formed in the device separating region 27, there is a possibility of a pinning deviation occurring at a peripheral part of the first groove portion 61 due to impurity activation through physical damage or ion irradiation onto a side wall and the bottom surface of the first groove portion 61. In regard to such a problem, in the rear-surface irradiation type solid-state imaging device 21 according to the first embodiment, the high-dielectric material film 62 having a substantial fixed charge is formed on the side wall and the bottom surface of the first groove portion 61, and thereby it is possible to suppress the pinning deviation.

[Modification]

Figure 4:
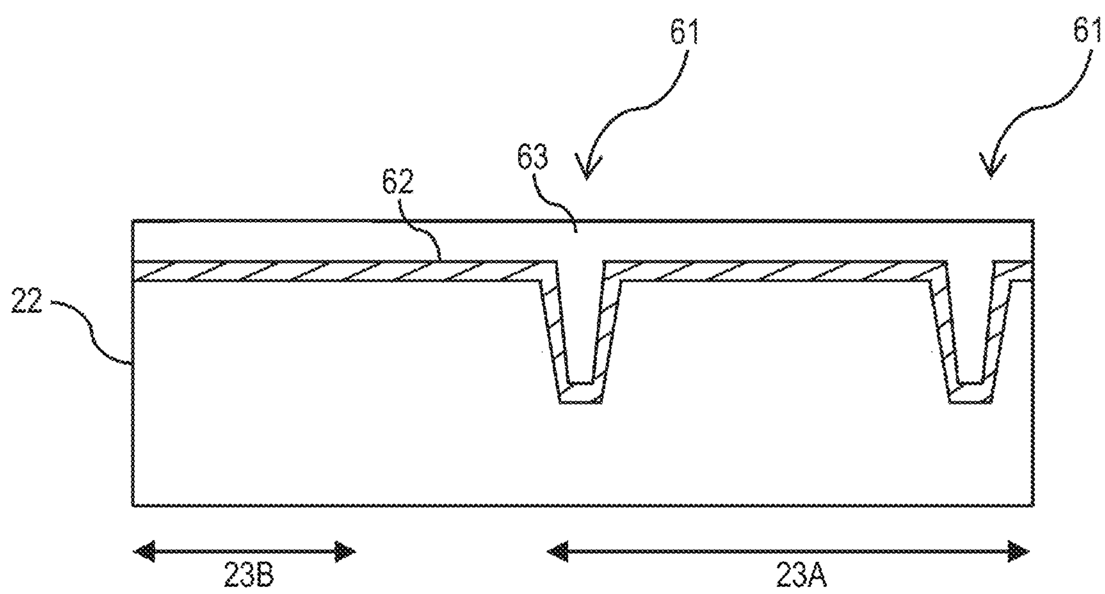
FIG. 4 is a schematic diagram illustrating a modification of the first embodiment of the solid-state imaging device according to the present disclosure.

In the first embodiment, description is made with respect to a case where the insulating material 63 is embedded in only the inside of the first groove 61 as an example, but as shown in FIG. 4, the insulating material 63 may be provided on the entire surface of the high-dielectric material film 62.

[Example of Method of Manufacturing Solid-State Imaging Device]

FIGS. 5A to 6B illustrate a method of manufacturing the solid-state imaging device 21 of the first embodiment. In addition, only a cross-sectional structure of a main part is shown in FIGS. 5A to 6B, and with respect to reference numerals of omitted parts, reference is made to FIG. 2.

In the method of manufacturing the solid-state imaging device 21 of the first embodiment, first, the photodiodes PD corresponding to each pixel separated by the device separating region 27 of the p-type semiconductor region is formed in a region where a pixel region of the silicon semiconductor substrate 22 is to be formed.

In addition, the photodiode PD is formed to have a pn conjunction composed of the n-type semiconductor region 25 formed across the entire region in the substrate thickness direction, and the p-type semiconductor region 26 that comes into contact with the n-type semiconductor region 25 and faces the front and rear surfaces 22A and 22B of the substrate.

The p-type semiconductor well region 28, which comes into contact with the device separating region 27, is formed in a region of the front surface 22A of the substrate, which corresponds to each pixel, and a plurality of pixel transistors Tr are formed in the p-type semiconductor well region 28, respectively. In addition, each of the pixel transistors Tr is formed by source and drain regions, a gate insulating film, and a gate electrode 29.

In addition, the multi-layered interconnection layer 33 where interconnections 32 of a plurality of layers are disposed via the interlayer insulating film 31 is formed above the front surface 22A of the substrate.

Figure 5A:
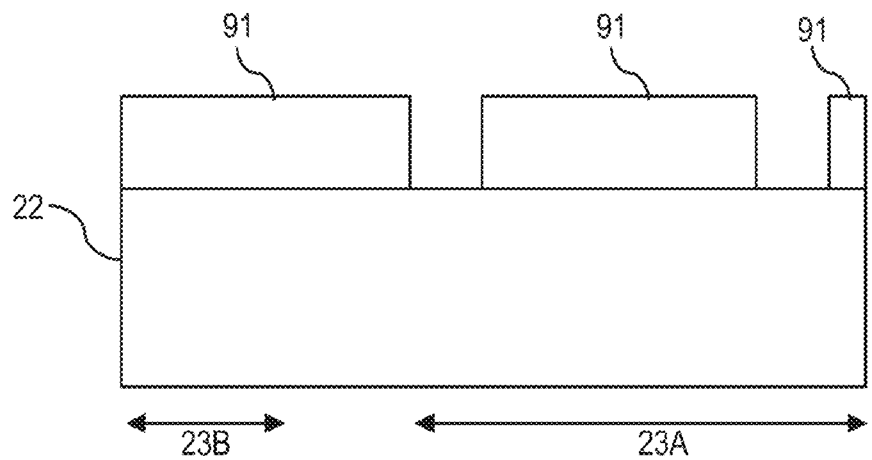
FIGS. 5A to 5C are schematic diagrams (1) illustrating a method of manufacturing the solid-state imaging device of the first embodiment.

Next, as shown in FIG. 5A, a positive-type photosensitive resist film 91 is formed on the rear surface 22B of the semiconductor substrate 22, and the patterning is performed using a general purpose photolithography technique in a manner such that an opening region having a line width of 100 to 300 nm is formed in the separating region 27.

Figure 5B:
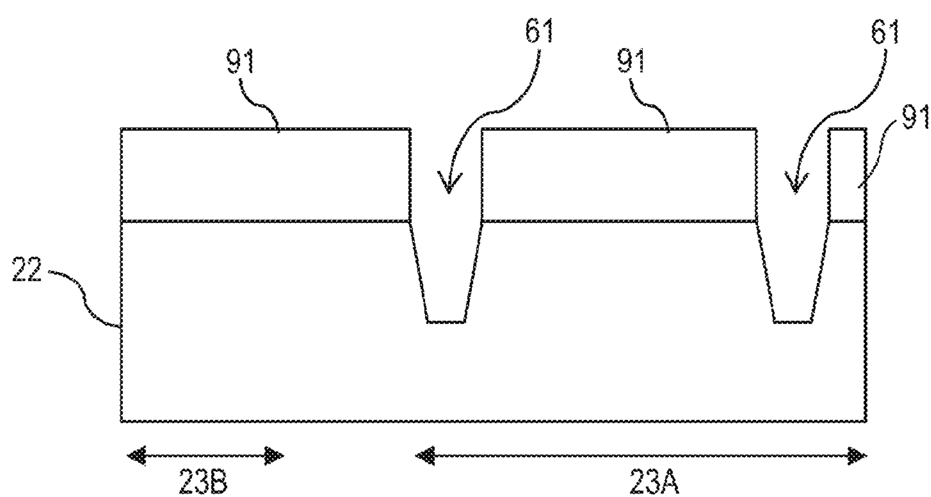

Subsequently, as shown in FIG. 5B, through a dry etching using $SF_6/O_2$-based gas, the semiconductor substrate 22 is dug to a depth of approximately 400 nm using the resist film 91 as a mask, and thereby the first groove portion 61 is formed. Then, the resist film 91 is removed.

Figure 5C:
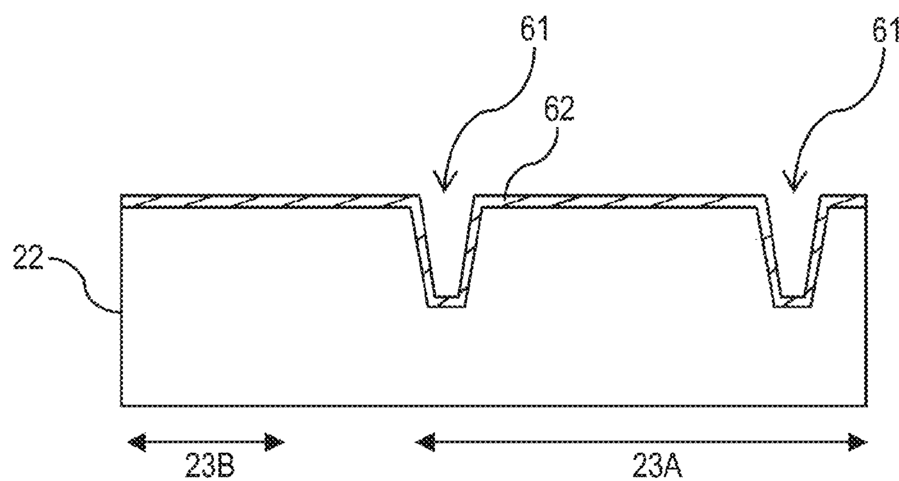
Figure 6A:
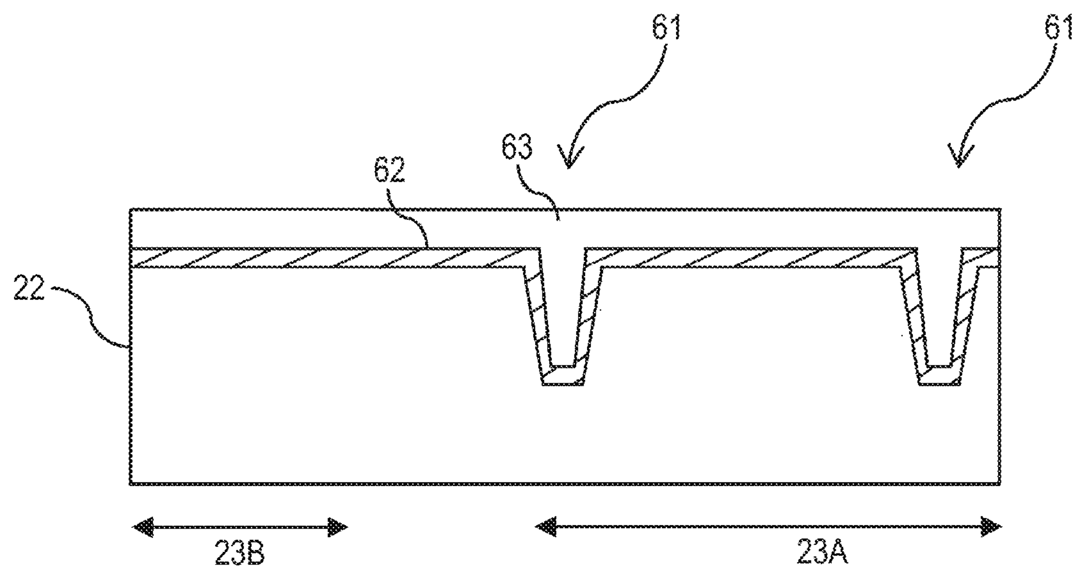
FIGS. 6A and 6B are schematic diagrams (2) illustrating a method of manufacturing the solid-state imaging device of the first embodiment.

Next, as shown in FIG. 5C, a hafnium oxide film (high-dielectric material film 62) is formed on the rear surface 22B of the semiconductor substrate 22 with a thickness of 50 nm by using a sputtering method. Furthermore, as shown in FIG. 6A, a silicon dioxide film (insulating film 63) is formed with a thickness of 200 nm on the hafnium oxide film by using a CVD method. As a result thereof, the first groove portion 61 is embedded with the hafnium oxide film and the silicon dioxide film.

Figure 6B:
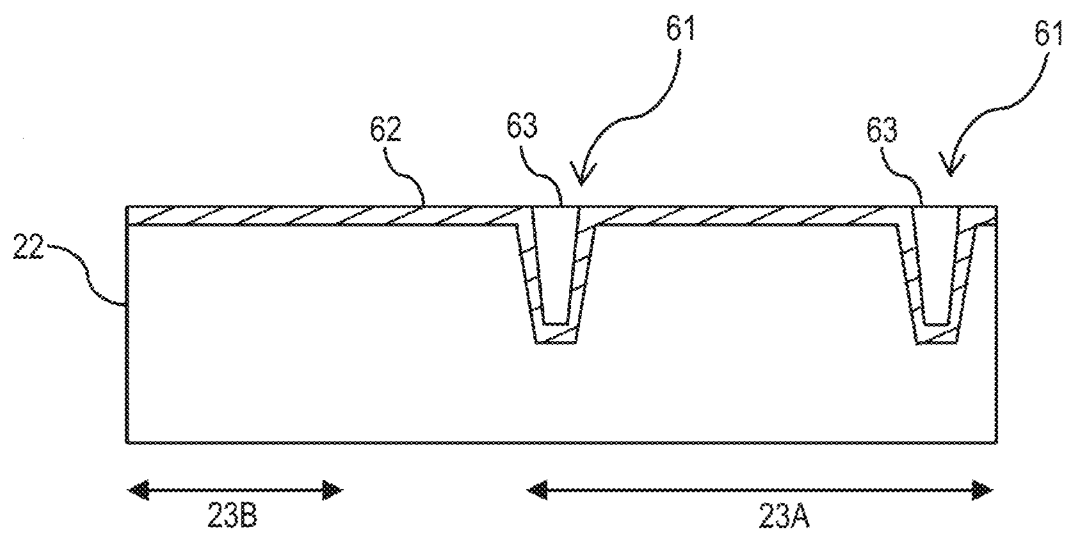

Next, as shown in FIG. 6B, a dry etching using $CF_4/O_2$-based gas is performed, and thereby the silicon dioxide other than the silicon dioxide embedded in first groove portion 61 is removed.

Then, the on-chip color filter 42 and the on-chip microlens 43 of, for example, a Bayer array are sequentially formed on the rear surface 22B of the semiconductor substrate 22. By doing so, it is possible to obtain the solid-state imaging device 21 of the first embodiment.

<3. Second Embodiment>

[Configurational Example of Solid-State Imaging Device]

Figure 7:
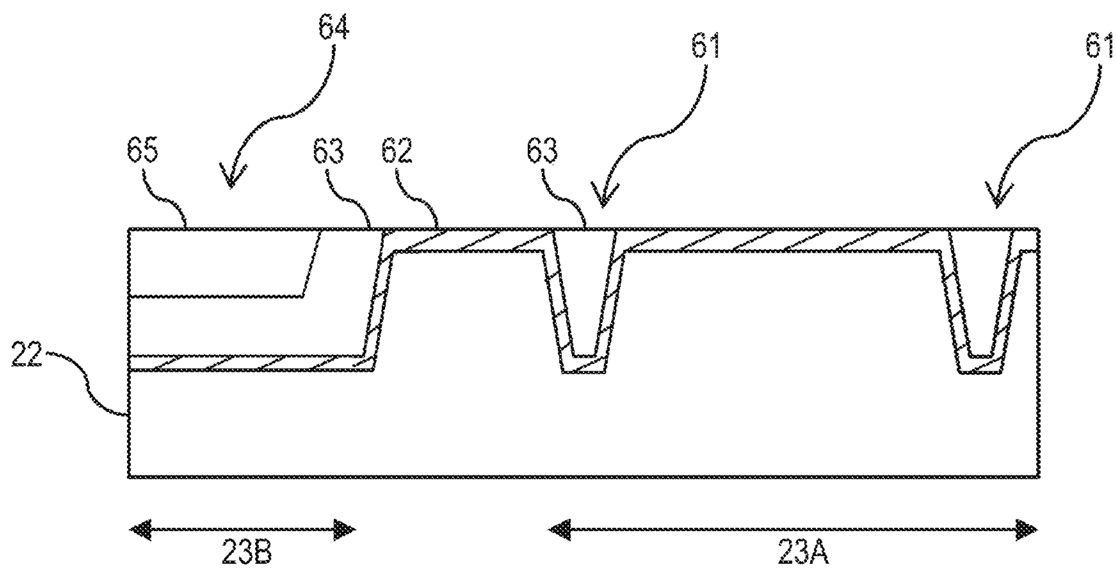
FIG. 7 is a schematic diagram illustrating a second embodiment of the solid-state imaging device according to the present disclosure.

FIG. 7 shows a schematic diagram illustrating a second embodiment of the solid-state imaging device according to the present disclosure. The solid-state imaging device according to this embodiment includes a first groove portion 61 that has a line width of 100 to 300 nm and that is formed in the device separating region 27 of the rear surface 22B of the substrate, which serves as the light receiving plane 34 of the photodiode PD, from the rear-surface 22B side. In addition, the first groove portion 61 is formed in a lattice shape to surround each pixel 24 in a plan view.

In addition, the solid-state imaging device according to this embodiment includes a second groove portion 64 that has a line width of approximately 500 μm and that is formed in the optical black region 23B of the rear surface 22B of the substrate, which serves as the light receiving plane 34 of the photodiode PD, from the rear-surface 22B side of the semiconductor substrate 22.

In addition, a high-dielectric material film 62 made of a hafnium oxide ($HfO_2$) film is formed on the rear surface 22B of the semiconductor substrate 22, and the high-dielectric material film 62 is formed on a side surface and the bottom surface of the first groove portion 61, and a side surface and the bottom surface of the second groove 64.

In addition, an insulating material 63 made of silicon dioxide is embedded in the first groove portion 61 via the high-dielectric material film 62. Meanwhile, an insulating material 63 made of silicon dioxide and a light shielding material 65 made of tungsten are embedded in the second groove portion 64 via the high-dielectric material film 62.

In the rear-surface irradiation type solid-state imaging device 21 according to the second embodiment, the optical black region 23B is provided with an embedded light-shielding structure configured by embedding the light shielding material 65 in the second groove portion 64, such that the lowering of the height of the solid-state imaging device can be realized.

Figure 8:
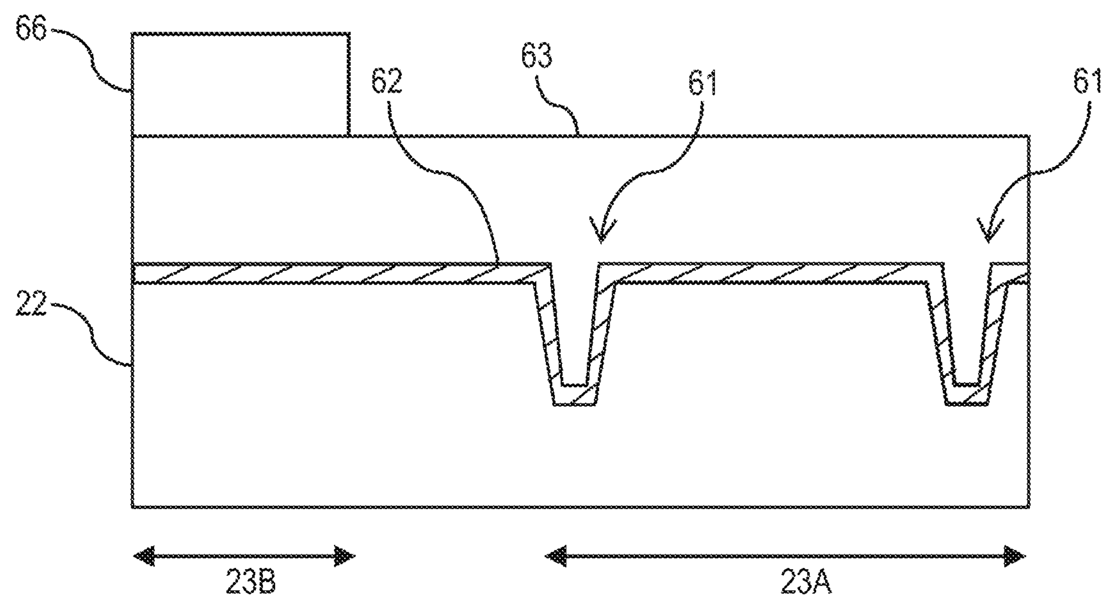
FIG. 8 is a schematic diagram illustrating a light-shielding of an optical black region in a case where embedded light-shielding is not performed.

That is, in a black level definition, it is necessary to forma film having a light shielding property in the optical black region 23B, and in a case where the embedded light-shielding is not performed, as shown in FIG. 8, it is necessary to form the light shielding film 66 on the rear surface 22B of the semiconductor substrate 22. In this case, due to the thickness of the light shielding film 66, the lowering of the height is interrupted. Conversely, in the rear-surface irradiation type solid-state imaging device 21 according to this embodiment, since the embedded light-shielding is adopted, the lowering of the height is realized, the distance from the on-chip microlens 43 to the photodiode PD becomes short, a light incidence efficiency is improved, and the prevention of the color mixture is further realized.

In the rear-surface irradiation type solid-state imaging device 21 according to the second embodiment, since adjacent light receiving sections are physically separated by the first groove portion 61, the optical color mixture that may occur between adjacent pixels can be diminished similarly to the first embodiment.

In addition, the high-dielectric material film 62 having a substantial fixed charge is formed on the side wall and the bottom surface of the first groove portion 61, and the side wall and the bottom surface of the second groove portion 64, such that it is possible to suppress the pinning deviation similarly to the first embodiment.

[Modification]

Figure 9:
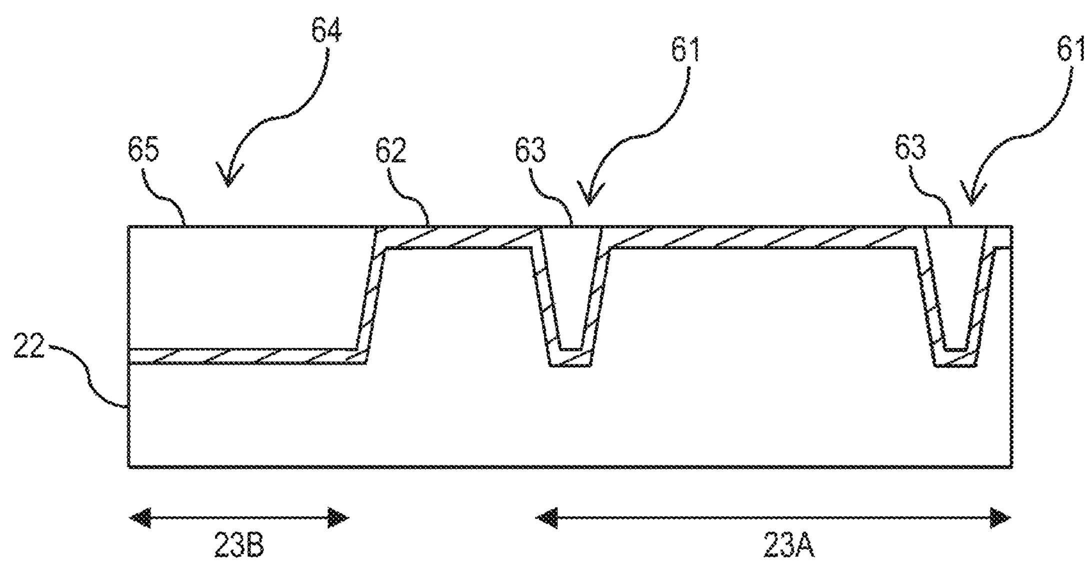
FIG. 9 is a schematic diagram illustrating a modification of the second embodiment of the solid-state imaging device according to the present disclosure.

In the second embodiment, description is made with respect to a case where the insulating material 63 and the light shielding material 65 are embedded in the second groove portion 64 via the high-dielectric material film 62 as an example, but the insulating material 63 is not necessarily required to be embedded. For example, as shown in FIG. 9, only the light shielding material 65 may be embedded in the second groove portion 64 via the high-dielectric material film 62.

[Example of Method of Manufacturing Solid-State Imaging Device]

FIGS. 10A to 11D illustrate a method of manufacturing the solid-state imaging device 21 of the second embodiment. In addition, only a cross-sectional structure of a main part is shown in FIGS. 10A to 11D, and with respect to reference numerals of omitted parts, reference is made to FIG. 2.

In the method of manufacturing the solid-state imaging device 21 of the second embodiment, the photodiode PD separated by the device separating region 27, the p-type semiconductor well region 28, the pixel transistor Tr, and the multi-layered interconnection layer 33 are formed, similarly to the first embodiment.

Figure 10A:
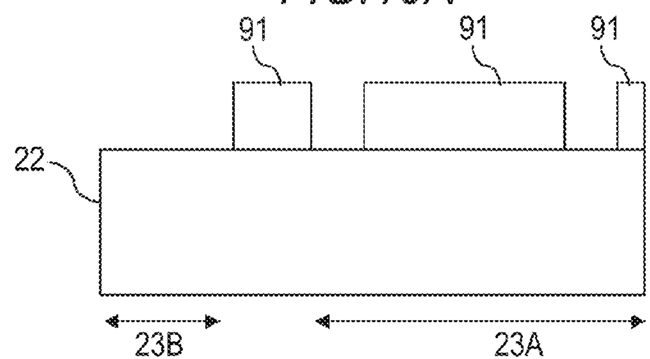
FIGS. 10A to 10D are schematic diagrams (1) illustrating a method of manufacturing the solid-state imaging device of the second embodiment.

Next, as shown in FIG. 10A, after a positive-type photosensitive resist film 91 is formed on the rear surface 22B of the semiconductor substrate 22, the resist film 91 is patterned using a general purpose photolithography technique. Specifically, the patterning is performed in a manner such that an opening region having a line width of 100 to 300 nm is formed in the device separating region 27, and an opening region having a line width of approximately 500 μm is formed in the optical black region 23B.

Figure 10B:
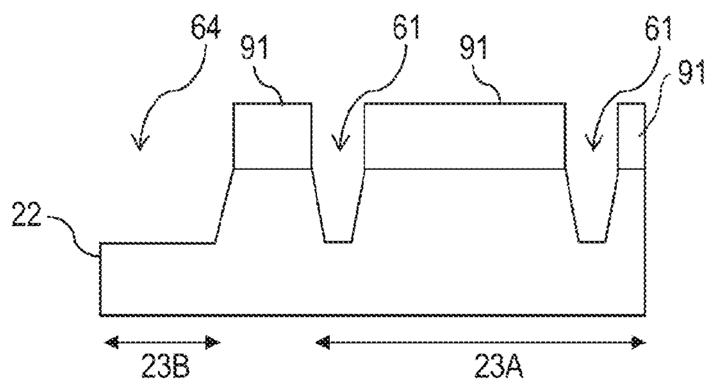

Subsequently, as shown in FIG. 10B, through a dry etching using $SF_6/O_2$-based gas, the semiconductor substrate 22 is dug in a depth of approximately 400 nm using the resist film 91 as a mask, and thereby the first groove portion 61 and the second groove portion 64 are formed. Then, the resist film 91 is removed.

Figure 10C:
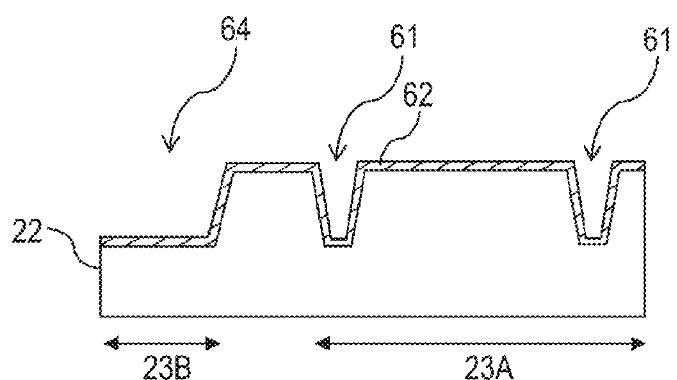
Figure 10D:
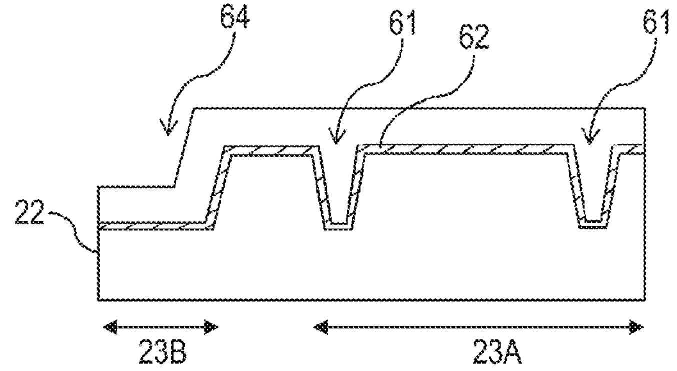

Next, as shown in FIG. 10C, a hafnium oxide film (high-dielectric material film 62) is formed on the rear surface 22B of the semiconductor substrate 22 with a thickness of 50 nm by using a sputtering method. Furthermore, as shown in FIG. 10D, a silicon dioxide film (insulating film 63) is formed with a thickness of 200 nm on the hafnium oxide film by using a CVD method. As a result thereof, the first groove portion 61 is embedded with the hafnium oxide film and the silicon dioxide film. In addition, the second groove portion 64 becomes a state of not being embedded.

Figure 11A:
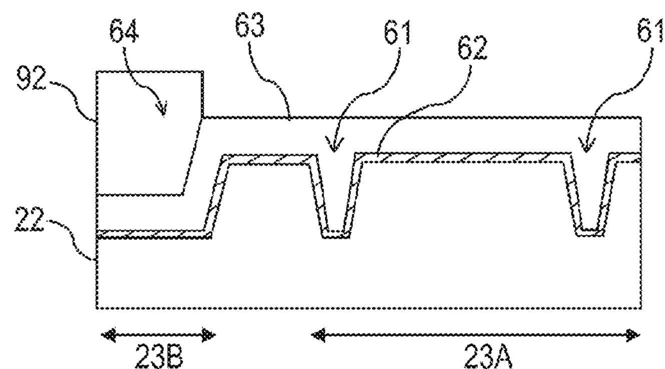
FIGS. 11A to 11D are schematic diagrams (2) illustrating a method of manufacturing the solid-state imaging device of the second embodiment.
Figure 11B:
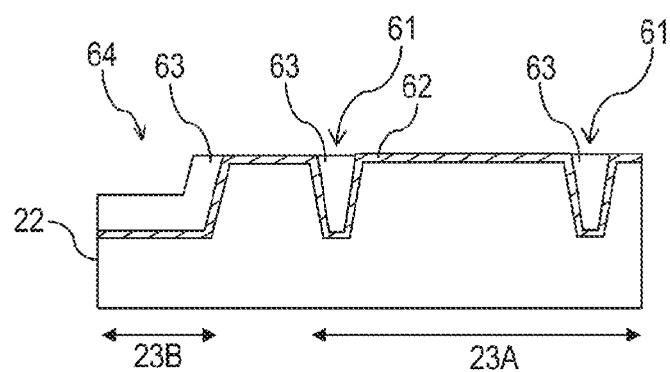

Subsequently, as shown in FIG. 11A, the silicon dioxide film (insulating film 63) that is formed on the bottom surface of the second groove portion 64 of the optical black region 23B is covered with a resist film 92, a dry etching using $CF_4/O_2$-based gas is performed, and thereby the resist film 92 is removed. As a result thereof, as shown in FIG. 11B, the silicon dioxide other than the silicon dioxide embedded in the first groove portion 61 and the second groove portion 64 is removed.

Figure 11C:
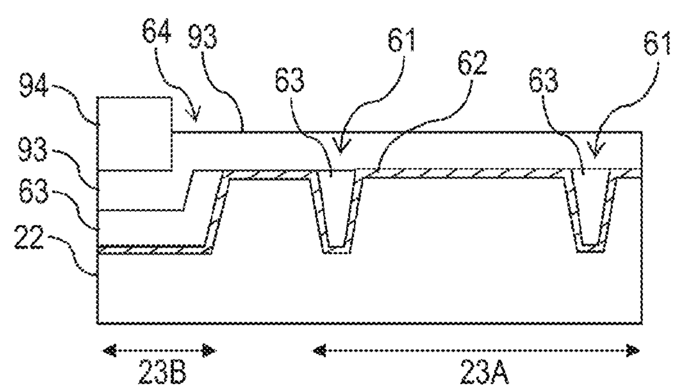

Next, as shown FIG. 11C, a light shielding film 93 made of tungsten is formed with a thickness of approximately 300 nm by a CVD method, and the light shielding film 93 formed on the bottom surface of the second groove portion 64 of the optical black region 23B is covered with a resist film 94.

Figure 11D:
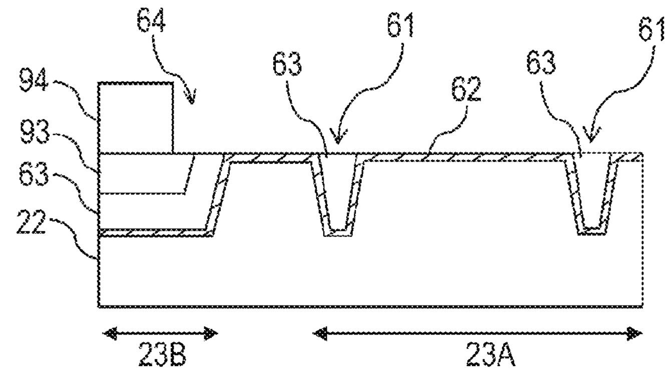

Consequently, as shown in FIG. 11D, a dry etching by $SF_6/O_2$-based gas is performed using the resist film 94 as a mask, and the exposed light shielding film 93 is etched and is removed. As a result thereof, when the resist film 94 is removed, the second groove portion 64 of the optical black region 23B is embedded with the hafnium oxide film, the silicon dioxide film, and the light shielding film.

Then, the on-chip color filter 42 and the on-chip microlens 43 of, for example, a Bayer array are sequentially formed on the rear surface 22B of the semiconductor substrate 22. By doing so, it is possible to obtain the solid-state imaging device 21 of the second embodiment.

4. Third Embodiment

[Configurational Example of Solid-State Imaging Device]

Figure 12:
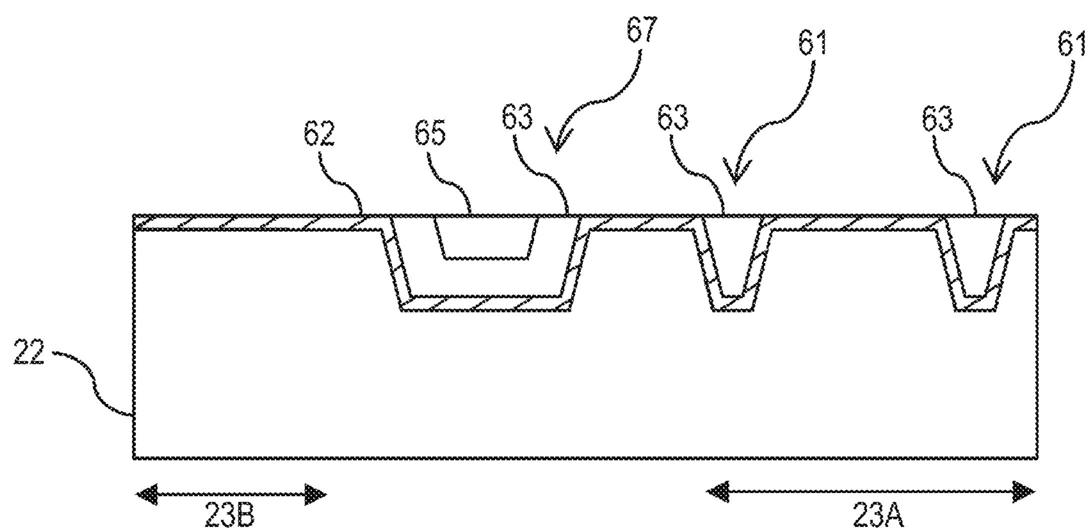
FIG. 12 is a schematic diagram illustrating a third embodiment of the solid-state imaging device according to the present disclosure.

FIG. 12 shows a schematic diagram illustrating a third embodiment of the solid-state imaging device according to the present disclosure. The solid-state imaging device according to this embodiment includes a first groove portion 61 that has a line width of 100 to 300 nm and that is formed in the device separating region 27 of the rear surface 22B of the substrate, which serves as the light receiving plane 34 of the photodiode PD, from the rear-surface 22B side of the semiconductor substrate 22. In addition, the first groove portion 61 is formed in a lattice shape to surround each pixel 24 in a plan view.

In addition, the solid-state imaging device according to this embodiment includes a third groove portion 67 that is formed in a region between the effective pixel region 23A and the optical black region 23B of the rear surface 22B of the substrate, which serves as the light receiving plane 34 of the photodiode PD, from the rear surface 22B of the semiconductor substrate 22.

In addition, a high-dielectric material film 62 made of a hafnium oxide ($HfO_2$) film is formed on the rear surface 22B of the semiconductor substrate 22, and the high-dielectric material film 62 is formed on a side surface and the bottom surface of the first groove portion 61, and a side surface and the bottom surface of the third groove 67.

In addition, an insulating material 63 made of silicon dioxide is embedded in the first groove portion 61 via the high-dielectric material film 62. On the other hand, an insulating material 63 made of silicon dioxide and a light shielding material 65 made of tungsten are embedded in the third groove portion 67 via the high-dielectric material film 62.

In rear-surface irradiation type solid-state imaging device 21 according to the third embodiment, the region between the effective pixel region 23A and the optical black region 23B is provided with an embedded light-shielding structure configured by embedding the light shielding material 65 in the third groove portion 67, such that it is possible to realize an increase in the black level. Specifically, the embedded light-shielding structure is provided between the effective pixel region 23A and the optical black region 23B, such that it is possible to suppress the sneaking of light into the optical black region 23B, and thereby the black level can be improved.

In addition, in the rear-surface irradiation type solid-state imaging device 21 according to the third embodiment, since adjacent light receiving sections are physically separated by the first groove portion 61, the optical color mixture that may occur between adjacent pixels can be diminished similarly to the first embodiment.

In addition, the high-dielectric material film 62 having a substantial fixed charge is formed on the side wall and the bottom surface of the first groove portion 61, and the side wall and the bottom surface of the third groove portion 67, such that it is possible to suppress the pinning deviation similarly to the first embodiment.

[Modification]

Figure 13:
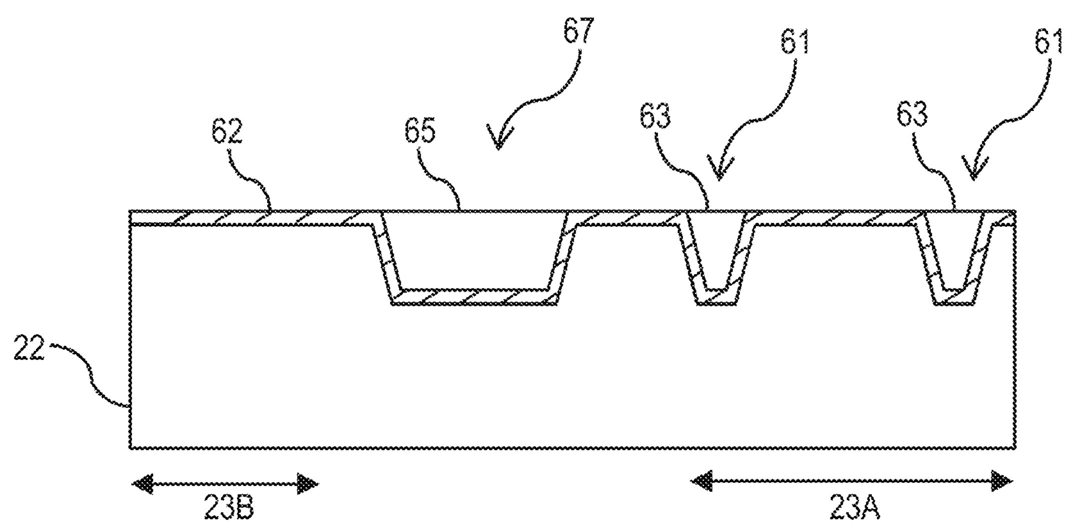
FIG. 13 is a schematic diagram illustrating a modification of the third embodiment of the solid-state imaging device according to the present disclosure.

In the third embodiment, description is made with respect to a case where the insulating material 63 and the light shielding material 65 are embedded in the third groove portion 67 via the high-dielectric material film 62 as an example, but the insulating material 63 is not necessarily required to be embedded. For example, as shown in FIG. 13, only the light shielding material 65 may be embedded in the third groove portion 67 via the high-dielectric material film 62.

[Example of Method of Manufacturing Solid-State Imaging Device]

FIGS. 14A to 15C illustrate a method of manufacturing the solid-state imaging device 21 of the third embodiment. In addition, only a cross-sectional structure of a main part is shown in FIGS. 14A to 15C, and with respect to reference numerals of omitted parts, reference is made to FIG. 2.

In the method of manufacturing the solid-state imaging device 21 of the third embodiment, the photodiode PD separated by the device separating region 27, the p-type semiconductor well region 28, the pixel transistor Tr, and the multi-layered interconnection layer 33 are formed, similarly to the first embodiment.

Figure 14A:
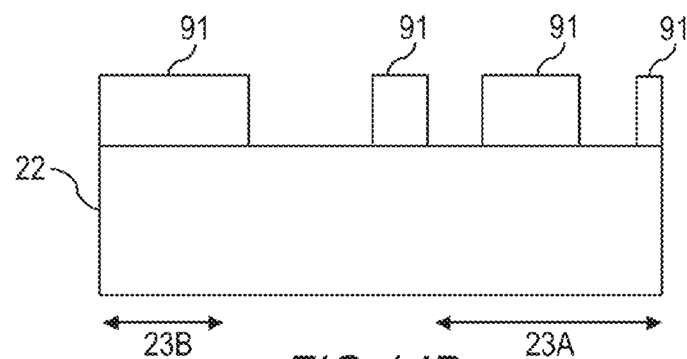
FIGS. 14A to 14D are schematic diagrams (1) illustrating a method of manufacturing the solid-state imaging device of the third embodiment.

Next, as shown in FIG. 14A, after a positive-type photosensitive resist film 91 is formed on the rear surface 22B of the semiconductor substrate 22, the resist film 91 is patterned using a general purpose photolithography technique. Specifically, the patterning is performed in a manner such that an opening region having a line width of 100 to 300 nm is formed in the device separating region 27, and an opening region is formed between the effective pixel region 23A and the optical black region 23B.

Figure 14B:
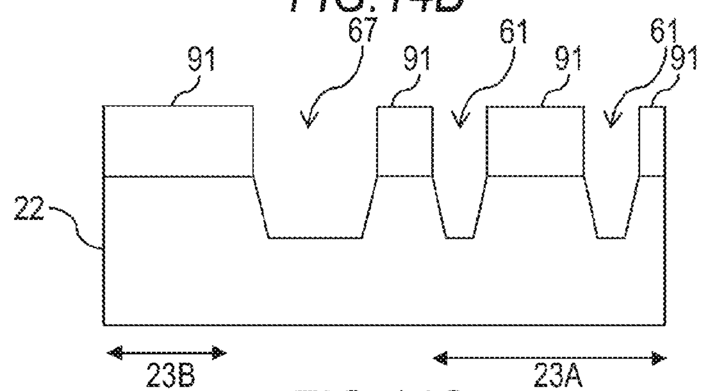

Subsequently, as shown in FIG. 14B, through a dry etching using $SF_6/O_2$-based gas, the semiconductor substrate 22 is dug in a depth of approximately 400 nm using the resist film 91 as a mask, and thereby the first groove portion 61 and the third groove portion 67 are formed. Then, the resist film 91 is removed.

Figure 14C:
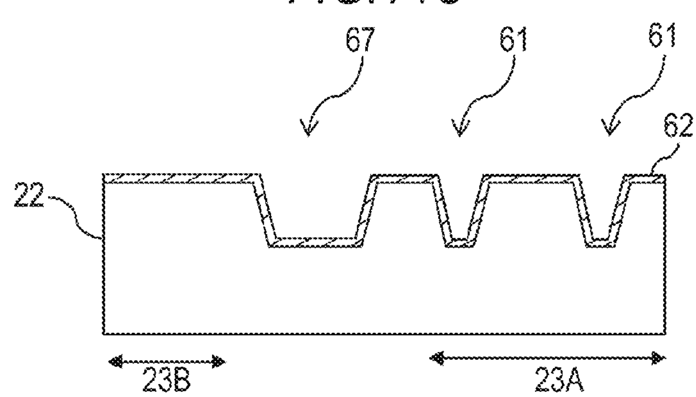
Figure 14D:
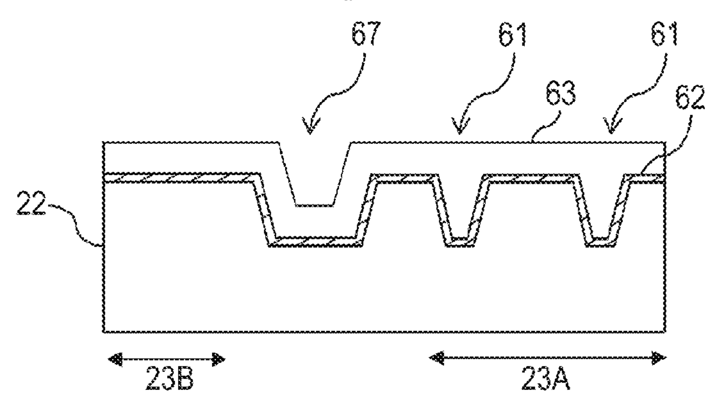

Next, as shown in FIG. 14C, a hafnium oxide film (high-dielectric material film 62) is formed on the rear surface 22B of the semiconductor substrate 22 with a thickness of 50 nm by using a sputtering method. Furthermore, as shown in FIG. 14D, a silicon dioxide film (insulating film 63) is formed with a thickness of 200 nm on the hafnium oxide film by using a CVD method. As a result thereof, the first groove portion 61 is embedded with the hafnium oxide film and the silicon dioxide film. In addition, the third groove portion 67 becomes a state of not being embedded.

Figure 15A:
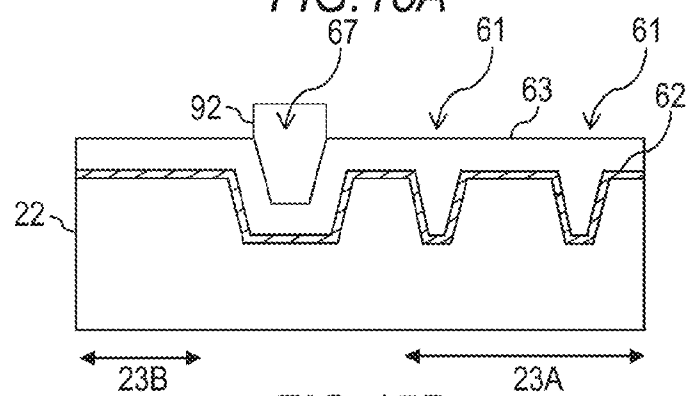
FIGS. 15A to 15D are schematic diagrams (2) illustrating a method of manufacturing the solid-state imaging device of the third embodiment.
Figure 15B:
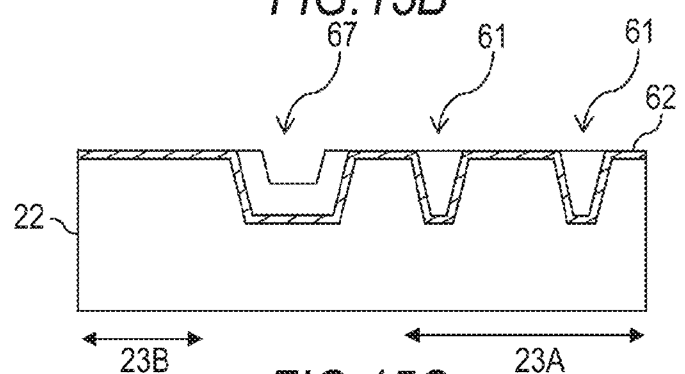

Subsequently, as shown in FIG. 15A, the silicon dioxide film (insulating film 63) that is formed on the bottom surface of the third groove portion 67 is covered with a resist film 92, a dry etching using $CF4/O_2$-based gas is performed, and then the resist film 92 is removed. As a result thereof, as shown in FIG. 15B, the silicon dioxide other than the silicon dioxide embedded in the first groove portion 61 and the third groove portion 67 is removed.

Figure 15C:
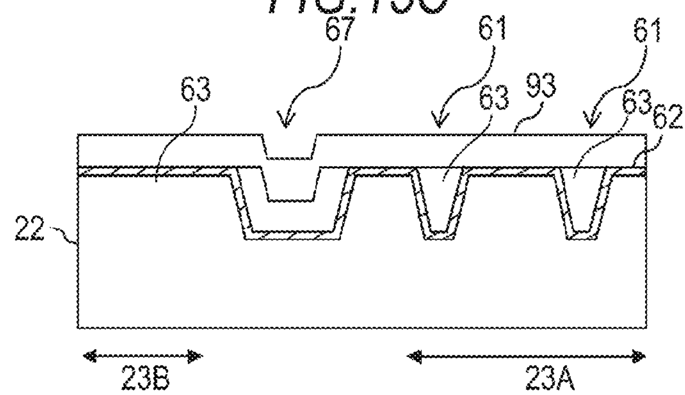
Figure 15D:
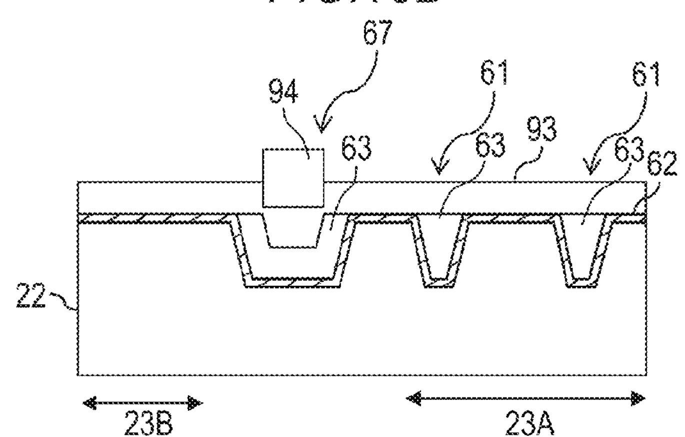

Next, as shown in FIG. 15C, a light shielding film 93 made of tungsten is formed with a thickness of approximately 300 nm by a CVD method, and then, as shown in FIG. 15D, the light shielding film 93 formed on the bottom surface of the third groove portion 67 is covered with a resist film 94.

Next, a dry etching by $SF_6/O_2$-based gas is performed using the resist film 94 as a mask, and the exposed light shielding film 93 is etched and is removed. As a result thereof, when the resist film 94 is removed, the third groove portion 67 is embedded with the hafnium oxide film, the silicon dioxide film, and the light shielding film.

Then, the on-chip color filter 42 and the on-chip microlens 43 of, for example, a Bayer array are sequentially formed on the rear surface 22B of the semiconductor substrate 22. By doing so, it is possible to obtain the solid-state imaging device 21 of the third embodiment.

<5. Fourth Embodiment<

[Configurational Example of Solid-State Imaging Device]

Figure 16:
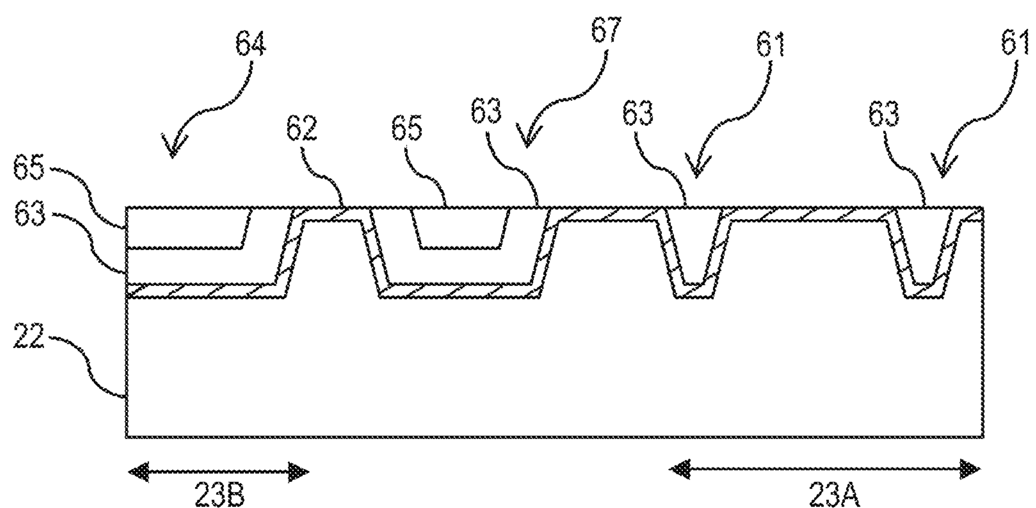
FIG. 16 is a schematic diagram illustrating a fourth embodiment of the solid-state imaging device according to the present disclosure.

FIG. 16 shows a schematic diagram illustrating a fourth embodiment of the solid-state imaging device according to the present disclosure. The solid-state imaging device according to this embodiment includes a first groove portion 61 that has a line width of 100 to 300 nm and that is formed in the device separating region 27 of the rear surface 22B of the substrate, which serves as the light receiving plane 34 of the photodiode PD, from the rear-surface 22B side of the semiconductor substrate 22. In addition, the first groove portion 61 is formed in a lattice shape to surround each pixel 24 in a plan view.

In addition, the solid-state imaging device according to this embodiment includes a second groove 64 that has a line width of approximately 500 μm and that is formed in the optical black region 23B of the rear surface 22B of the substrate, which serves as the light receiving plane 34 of the photodiode PD, from the rear surface 22B side of the semiconductor substrate 22.

In addition, the solid-state imaging device according to this embodiment includes a third groove portion 67 that is formed in a region between the effective pixel region 23A and the optical black region 23B of the rear surface 22B of the substrate, which serves as the light receiving plane 34 of the photodiode PD, from the rear surface 22B of the semiconductor substrate 22.

In addition, a high-dielectric material film 62 made of a hafnium oxide ($HfO_2$) film is formed on the rear surface 22B of the semiconductor substrate 22, and the high-dielectric material film 62 is formed on a side surface and the bottom surface of the first groove portion 61, a side surface and the bottom surface of the second groove 64, and a side surface and the bottom surface of the third groove 67.

In addition, an insulating material 63 made of silicon dioxide is embedded in the first groove portion 61 via the high-dielectric material film 62. On the other hand, an insulating material 63 made of silicon dioxide and a light shielding material 65 made of tungsten are embedded in the second groove 64 and the third groove portion 67 via the high-dielectric material film 62.

In addition, in the rear-surface irradiation type solid-state imaging device 21 according to the fourth embodiment, since adjacent light receiving sections are physically separated by the first groove portion 61, the optical color mixture that may occur between adjacent pixels can be diminished similarly to the first embodiment.

In addition, the high-dielectric material film 62 having a substantial fixed charge is formed on the side wall and the bottom surface of the first groove portion 61, the side wall and the bottom surface of the second groove portion 64, and the side wall and the bottom surface of the third groove portion 67, such that it is possible to suppress the pinning deviation similarly to the first embodiment.

In addition, in the rear-surface irradiation type solid-state imaging device 21 according to the fourth embodiment, the embedded light-shielding structure is formed in the optical black region 23B, such that the lowering of the height of the solid-state imaging device can be realized similarly to the second embodiment.

In addition, in the rear-surface irradiation type solid-state imaging device 21 according to the fourth embodiment, the embedded light-shielding configured by embedding the light shielding material 65 in the third groove portion 67 is provided, such that it is possible to realize an increase in the black level similarly to the third embodiment.

[Modification]

Figure 17:
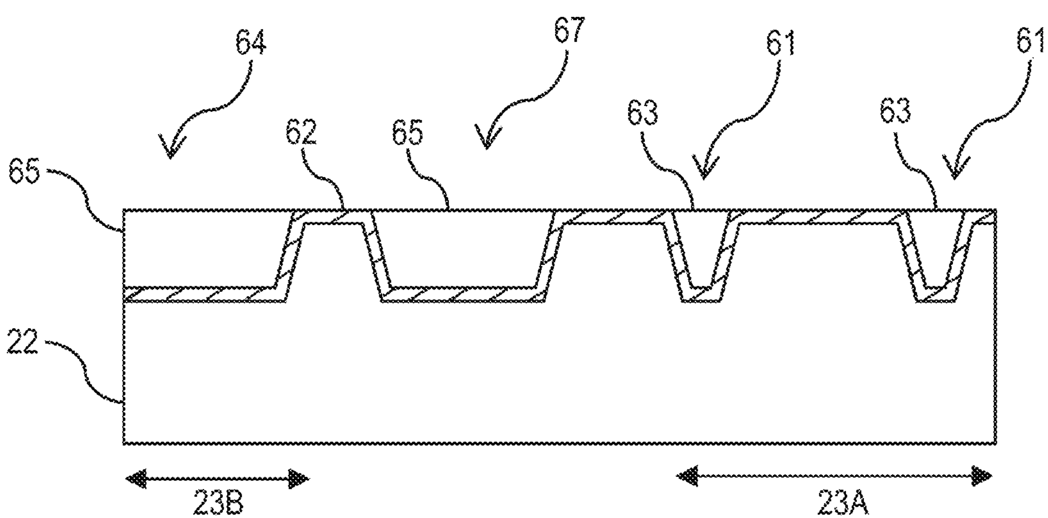
FIG. 17 is a schematic diagram illustrating a modification of the fourth embodiment of the solid-state imaging device according to the present disclosure.

In the fourth embodiment, description is made with respect to a case where the insulating material 63 and the light shielding material 65 are embedded in the second groove portion 69 and the third groove portion 67 via the high-dielectric material film 62 as an example, but the insulating material 63 is not necessarily required to be embedded. For example, as shown in FIG. 17, only the light shielding material 65 may be embedded in the second groove portion 69 and the third groove portion 67 via the high-dielectric material film 62.

[Example of Method of Manufacturing Solid-State Imaging Device]

FIGS. 18A to 19D illustrate a method of manufacturing the solid-state imaging device 21 of the fourth embodiment. In addition, only a cross-sectional structure of a main part is shown in FIGS. 18A to 19D, and with respect to reference numerals of omitted parts, reference is made to FIG. 2.

In the method of manufacturing the solid-state imaging device 21 of the fourth embodiment, the photodiode PD separated by the device separating region 27, the p-type semiconductor well region 28, the pixel transistor Tr, and the multi-layered interconnection layer 33 are formed, similarly to the first embodiment.

Figure 18A:
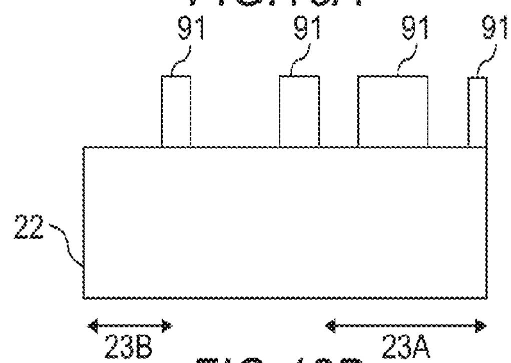
FIGS. 18A to 18D are schematic diagrams (1) illustrating a method of manufacturing the solid-state imaging device of the fourth embodiment.

Next, as shown in FIG. 18A, after a positive-type photosensitive resist film 91 is formed on the rear surface 22B of the semiconductor substrate 22, the resist film 91 is patterned using a general purpose photolithography technique. Specifically, the patterning is performed in a manner such that an opening region having a line width of 100 to 300 nm is formed in the device separating region 27, and an opening region having a line width of approximately 500 μm is formed in the optical black region 23B. In addition, when the patterning is performed simultaneously, an opening region is also formed between the effective pixel region 23A and the optical black region 23B.

Figure 18B:
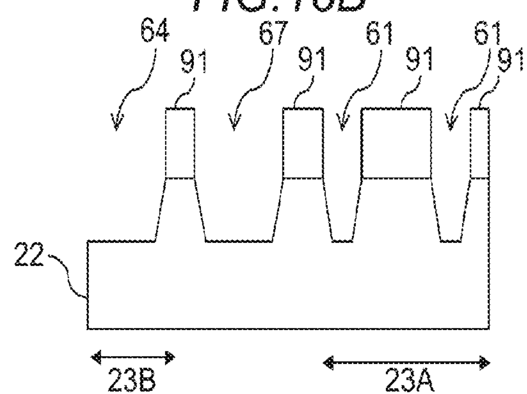

Subsequently, as shown in FIG. 18B, through a dry etching using $SF_6/O_2$-based gas, the semiconductor substrate 22 is dug in a depth of approximately 400 nm using the resist film 91 as a mask, and thereby the first groove portion 61, the second groove portion 64, and the third groove portion 67 are formed. Then, the resist film 91 is removed.

Figure 18C:
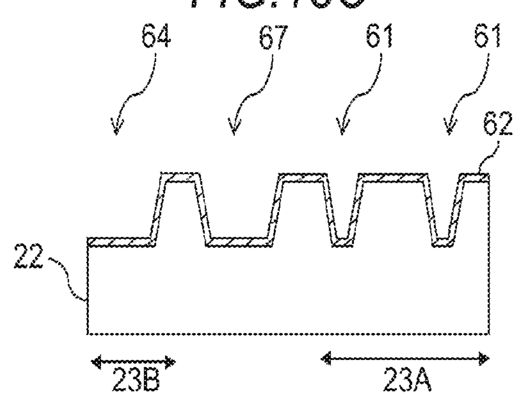
Figure 18D:
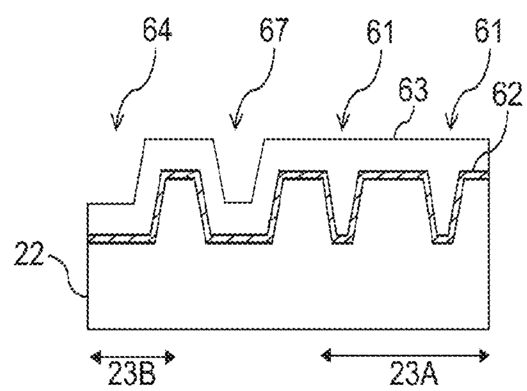

Next, as shown in FIG. 18C, a hafnium oxide film (high-dielectric material film 62) is formed on the rear surface 22B of the semiconductor substrate 22 with a thickness of 50 nm by using a sputtering method. Furthermore, as shown in FIG. 18D, a silicon dioxide film (insulating film 63) is formed with a thickness of 200 nm on the hafnium oxide film by using a CVD method. As a result thereof, the first groove portion 61 is embedded with the hafnium oxide film and the silicon dioxide film. In addition, the second groove portion 64 and the third groove portion 67 become a state of not being embedded.

Figure 19A:
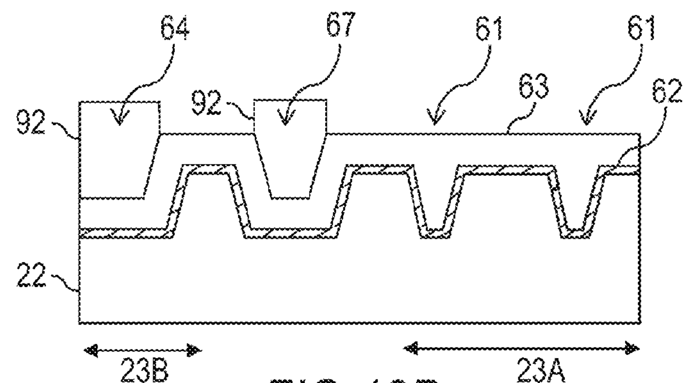
FIGS. 19A to 19D are schematic diagrams (2) illustrating a method of manufacturing the solid-state imaging device of the fourth embodiment.
Figure 19B:
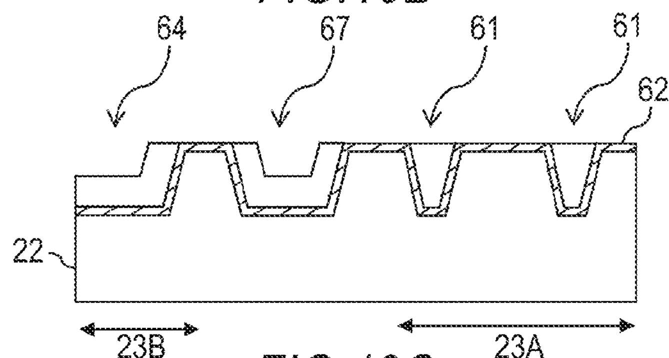

Subsequently, as shown in FIG. 19A, the silicon dioxide film (insulating film 63) that is formed on the bottom surface of each of the second groove portion 64 and the third groove portion 67 is covered with a resist film 92, a dry etching using $CF_4/O_2$-based gas is performed, and thereby the resist film 92 is removed. As a result thereof, as shown in FIG. 19B, the silicon dioxide other than the silicon dioxide embedded in the first groove portion 61, the second groove portion 64, and the third groove portion 67 is removed.

Figure 19C:
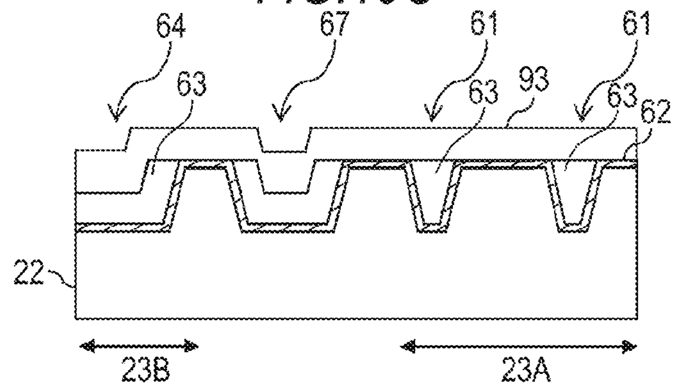
Figure 19D:
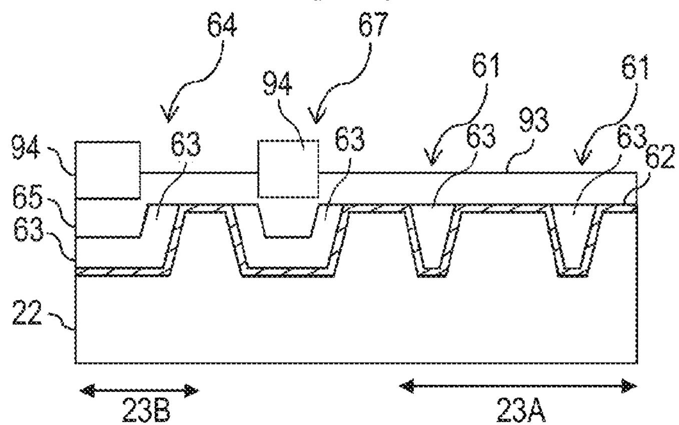

Next, as shown FIG. 19C, a light shielding film 93 made of tungsten is formed with a thickness of approximately 300 nm by a CVD method, and as shown in FIG. 19D, light shielding film 93 formed on the bottom surface of each of the second groove portion 64 and the third groove portion 67 is covered with resist film 94.

Next, a dry etching by $SF_6/O_2$-based gas is performed using the resist film 94 as a mask, and the exposed light shielding film 93 is etched and is removed. As a result thereof, when the resist film 94 is removed, the second groove portion 64 of the optical black region 23B is embedded with the hafnium oxide film, the silicon dioxide film, and the light shielding film. In addition, the third groove portion 67 that is formed in a region between the effective pixel region 23A and the optical black region 23B is also embedded by the hafnium oxide film, the silicon dioxide film, and the light shielding film.

Then, the on-chip color filter 42 and the on-chip microlens 43 of, for example, a Bayer array are sequentially formed on the rear surface 22B of the semiconductor substrate 22. By doing so, it is possible to obtain the solid-state imaging device 21 of the second embodiment.

<6. Fifth Embodiment>

[Configuration of Camera]

Figure 20:
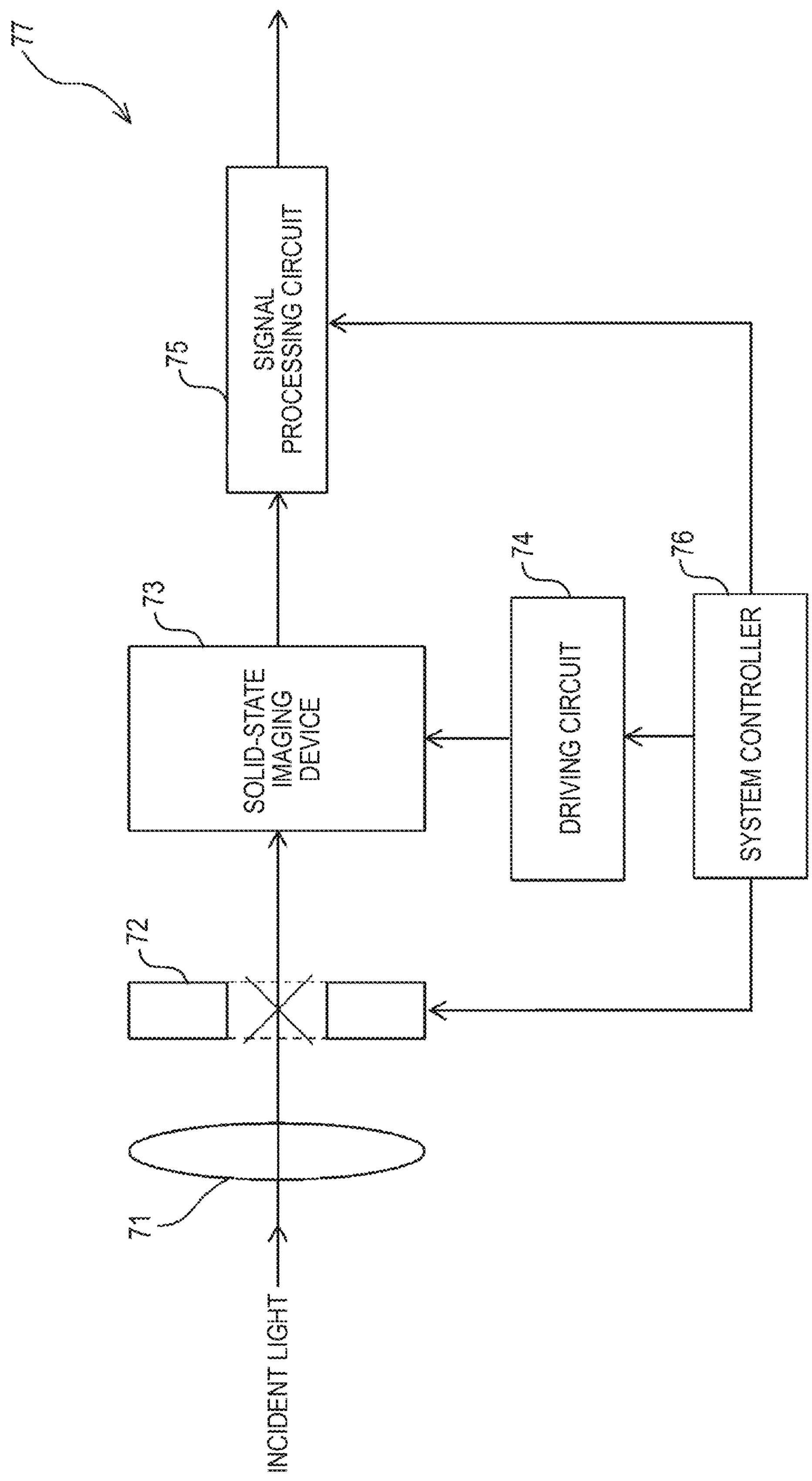
FIG. 20 is a schematic diagram illustrating an example of an imaging apparatus to which the present disclosure is applied.

FIG. 20 shows a schematic diagram illustrating a camera 77 that is an example of an imaging apparatus to which the present disclosure is applied. In addition, the camera 77 shown in FIG. 20 uses the above described solid-state imaging device of the first to fourth embodiments as an imaging device.

In the camera 77 to which the present disclosure is applied, light from an object (not shown), is incident to an imaging area of a solid-state imaging device 73 via an optical system such as the lens 71, and a mechanical shutter 72. In addition, the mechanical shutter 72 blocks out the incidence of light to the imaging area of the solid-state imaging device 73 and determines an exposure period.

Here, as the solid-state imaging device 73, the above-described solid-state imaging device 1 according to the first to fourth embodiments is used, and the solid-state imaging device 73 is driven by a driving circuit 74 including a timing generating circuit, a driving system, or the like.

In addition, an output signal of the solid-state imaging device 73 is subjected to various signal processes by a next stage signal processing circuit 75, and is derived to the outside as an imaging signal, the derived imaging signal is stored in a storage medium such as a memory, and is output to a monitor.

In addition, an opening and closing control of the mechanical shutter 72, a control of the driving circuit 74, a control of the signal processing circuit 75, or the like is performed by a system controller 76.

In the camera to which the present disclosure is applied, the solid-state imaging device to which the above-described present disclosure is applied is adopted, such that it is possible to suppress the occurrence of an optical color mixture, and it is possible to obtain a pickup image having a high image quality.

<7. Modification>

[In Regard to Color Filter]

In the above-described first to fifth embodiments, description is made with respect to a case where the color filter 42 arranged in a RGB Bayer array is used, but an organic photoelectric conversion film may be used to realize a solid-state imaging device with high accuracy by improving color reproducibility.

Figure 21:
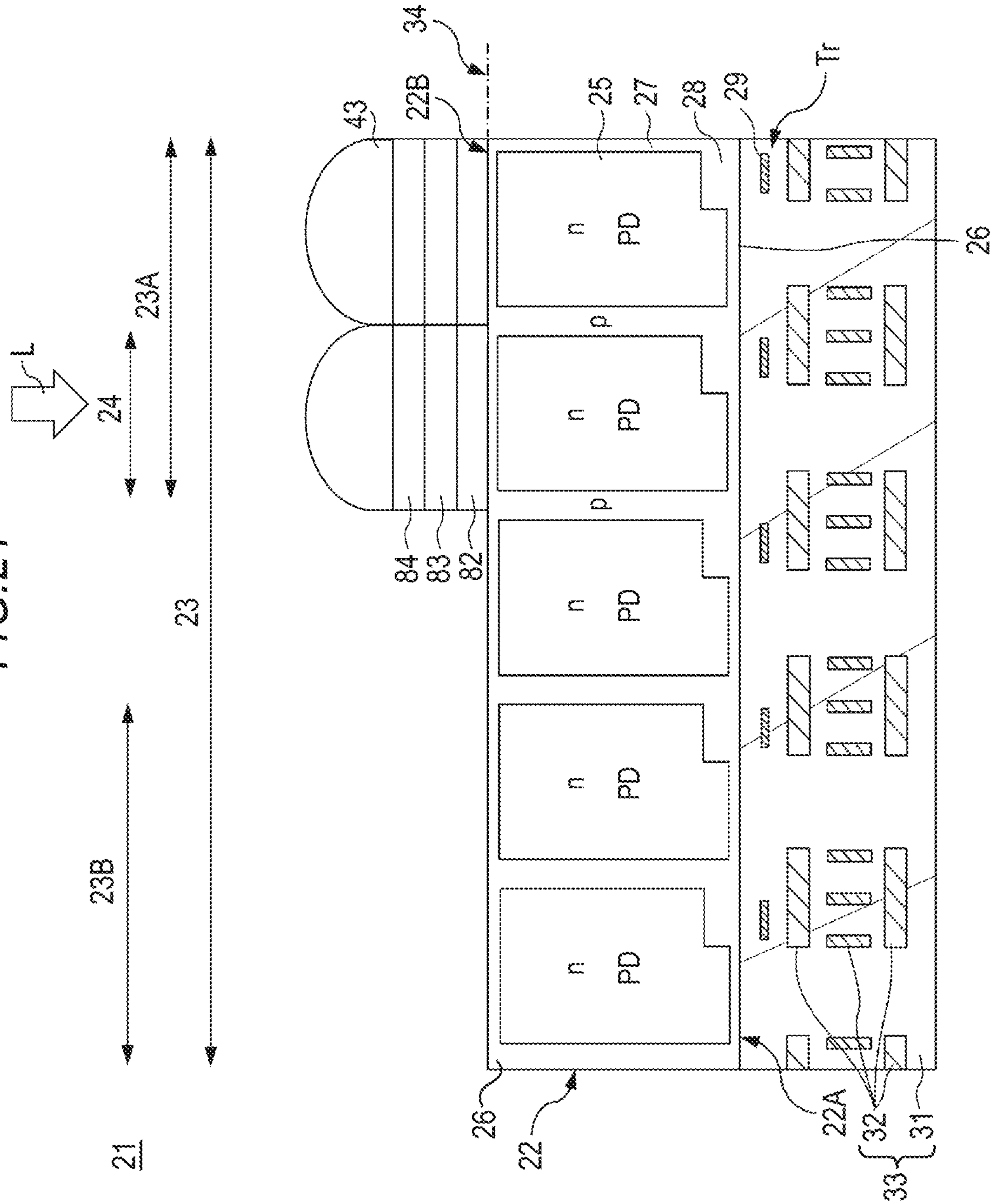
FIG. 21 is a schematic diagram illustrating a modification of the first embodiment.

FIG. 21 shows a schematic diagram illustrating a modification of the first embodiment. In the solid-state imaging device 21 shown in FIG. 21, an organic photoelectric conversion film 82 is formed on the rear surface 22B of the semiconductor substrate 22, and an organic color filter layer 84 is further formed via a separation layer 83.

The organic color filter layer 84 is formed correspondingly to the photodiode PD, and for example, to read out blue (B)

and red (R), an organic color filter layer 84C of Cyan and organic color filter layer 84Y of Yellow are disposed in a checkerboard pattern. In addition, an on-chip microlens 43, which focuses the incident light to each photodiode PD, is formed on the organic color filter layer 84.

As the green (G)-based dye of the organic photoelectric conversion film 82, rhodamine-based dye, phthalocyanine derivative, quinacridone, eosin-Y, meracyanine-based dye, or the like may be exemplified as an example thereof.

In the solid-state imaging device 21 of this modification, green (G) is extracted from the organic photoelectric film 82, blue (B) and red (R) are extracted from a combination of the organic color filter layers 84 of Cyan and Yellow.

Hereinafter, an example of a planar arrangement (coding) of the organic photoelectric conversion film 82 and the organic color filter layer 84 will be described with reference to FIGS. 22A and 22B.

Figure 22A:
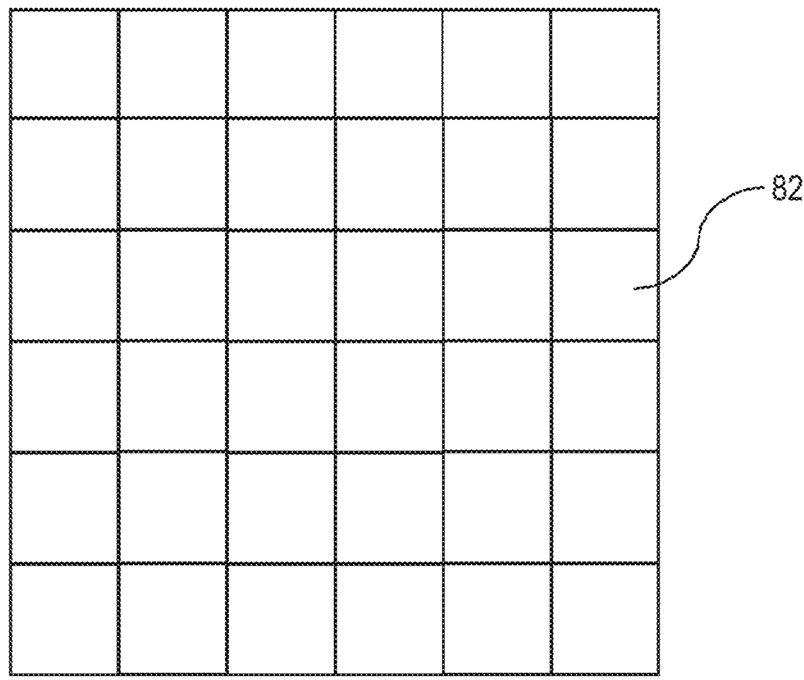
FIGS. 22A and 22B are schematic diagrams illustrating an example of a planar arrangement (coding) of an organic photoelectric conversion film and an organic color filter layer.
Figure 22B:
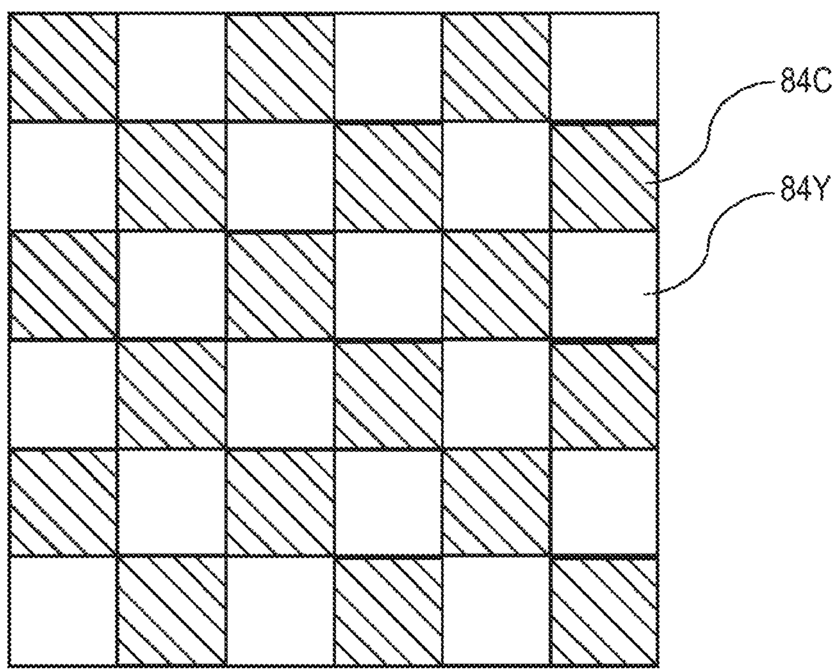

As shown in FIG. 22A, green (G) made of the organic photoelectric conversion film 82 is arranged in all pixels. In addition, as shown in FIG. 22B, Cyan and Yellow are arranged in a so-called checkerboard pattern. A spectroscopy of blue (B) and red (R) is accomplished by the following principle.

Specifically, in regard to blue (B), a red (R) component is absorbed by the organic color filter layer 845 of Cyan and is removed, and then a green (G) component is absorbed by the organic photoelectric conversion film 82 of green (G) and is removed, and accordingly, the blue (B) can be extracted as a remaining blue (B) component.

On the other hand, in regard to red (R), a blue component (B) is absorbed by the organic color filter layer 84Y of Yellow and is removed, and then a green (G) component is absorbed by the organic photoelectric conversion film 82 of green (G) and is removed, and accordingly, the red (R) can be extracted as a remaining red (R) component.

By the above-described configuration, a color signal separated into green (G), blue (B), and red (R) can be output.

In addition, since the organic color filter layer 840 of Cyan and the organic color filter layer 84Y of Yellow are arranged in a so-called checkerboard pattern, a spatial brightness or a chromatic resolution is diminished a little. However, it is possible to remarkably improve the color reproducibility.

[In Regard to Semiconductor Substrate]

In the above-described first to fourth embodiments, description is made with respect to a case where the semiconductor substrate is made of silicon as an example, but the semiconductor substrate is not necessarily required to be a silicon substrate, and the semiconductor substrate may be made another semiconductor material.

[In Regard to High-Dielectric Material Film]

In the above-described first to fourth embodiments, description is made with respect to a case where a hafnium oxide film is used as the high-dielectric material film 62 as an example, but it is not necessarily required to use the hafnium oxide film. That is, as long as the pinning deviation caused by the forming of the first groove portion 61, the second groove portion 64, or the third groove portion 67 can be sufficiently suppressed, it is not necessarily required to use the hafnium oxide film. For example, a tantalum pentoxide ($Ta_2O_5$) film, a zirconium dioxide ($ZrO_2$) film, or the like may be used.

[In Regard to Embedded Light-Shielding]

In the above-described second to fourth embodiments, description is made with respect to a case where tungsten is used as the light shielding material 65 as an example, but is the use of tungsten not necessarily required. That is, as long as the embedded light-shielding structure can be sufficiently configured, for example, aluminum or the like may be embedded.

The present disclosure contains subject matter related to that disclosed in Japanese Priority Patent Application JP 2010-169911 filed in the Japan Patent Office on Jul. 29, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:

a semiconductor substrate having an effective pixel region including a first plurality of photoelectric conversion elements configured to receive light, an optical black region including a second plurality of photoelectric conversion elements, a first groove portion provided between adjacent photoelectric conversion elements in the effective pixel region, a second groove portion provided in the optical black region; and a third groove portion provided between the first groove portion and the second groove portion;

an insulating material disposed, at least in part, in the first groove portion;

a metallic oxide disposed, at least in part, in the first groove portion and the third groove portion, wherein the metallic oxide extends from the first groove portion to the third groove portion along a surface of the semiconductor substrate; and a peripheral circuit configured to perform analog-to-digital conversion.

2. The imaging device of claim 1, wherein the metallic oxide comprises hafnium oxide($HfO_2$).

3. The imaging device of claim 1, wherein the metallic oxide is selected from the group consisting of hafnium oxide, tantalum pentoxide, and zirconium dioxide.

4. The imaging device of claim 1, wherein the insulating material comprises silicon dioxide ($SiO_2$).

5. The imaging device of claim 1, wherein the insulating material is disposed adjacent to the metallic oxide in the first groove portion.

6. The imaging device of claim 1, wherein the first groove portion has a width that narrows with depth of the first groove portion in the semiconductor substrate.

7. The imaging device of claim 6, wherein the first groove portion has a width that continuously narrows with depth of the first groove portion in the semiconductor substrate.

8. The imaging device of claim 1, wherein the first groove portion is included in a lattice-shaped grooving portion that surrounds at least one photoelectric conversion element of the first plurality of photoelectric conversion elements in the effective pixel region in a plan view.

9. The imaging device of claim 8, wherein the lattice-shaped grooving portion surrounds each photoelectric conversion element of the first plurality of photoelectric conversion elements in the effective pixel region in a plan view.

10. The imaging device of claim 1, wherein a maximum depth dimension of the first groove portion is larger than a maximum width dimension of the first groove portion.

11. The imaging device of claim 1, further comprising:

an insulating material disposed, at least in part, in the second groove portion; and a metallic oxide disposed, at least in part, in the second groove portion.

12. The imaging device of claim 11, wherein the insulating material disposed, at least in part, in the second groove portion is a same insulating material as the insulating material disposed, at least in part, in the first groove portion.

13. The imaging device of claim 11, wherein the metallic oxide disposed, at least in part, in the second groove portion is a same metallic oxide as the metallic oxide disposed, at least in part, in the first groove portion.

14. The imaging device of claim 1, wherein at least part of the optical black region is configured to be shielded from incident light.

15. The imaging device of claim 14, wherein the at least part of the optical black region comprises tungsten.

16. The imaging device of claim 1, wherein the imaging device is a rear-surface irradiation type.

17. The imaging device of claim 1, further comprising an interconnection layer, wherein the semiconductor substrate is disposed between the interconnection layer and a plurality of color filters configured to receive light.

18. The imaging device of claim 1, wherein a part of the insulating material is disposed outside the first groove portion.

19. The imaging device of claim 18, further comprising a color filter layer formed adjacent to the part of the insulating material disposed outside the first groove portion.

20. The imaging device of claim 19, wherein the color filter layer is an RGB color filter layer.

21. The imaging device of claim 19, further comprising a plurality of microlenses formed adjacent to the color filter layer.

22. The imaging device of claim 21, wherein the plurality of microlenses comprise an organic material.

23. The imaging device of claim 1, wherein the first plurality of photoelectric conversion elements share a reset transistor, an amplification transistor, and an address transistor.

24. The imaging device of claim 23, further comprising a driving interconnection connected to a gate of a transfer transistor, wherein the driving interconnection is disposed in a horizontal direction.

25. The imaging device of claim 23, further comprising a driving interconnection connected to a gate of the reset transistor, wherein the driving interconnection is disposed in a horizontal direction.

26. The imaging device of claim 23, further comprising a driving interconnection connected to a gate of the address transistor, wherein the driving interconnection is disposed in a horizontal direction.

27. The imaging device of claim 23, further comprising a signal line connected to the address transistor, wherein the signal line is disposed in a vertical direction.

28. The imaging device of claim 1, wherein the first plurality of photoelectric conversion elements comprise n-type regions of the semiconductor substrate.

29. The imaging device of claim 1, wherein the first groove portion is provided in a p-type region of the semiconductor substrate.

30. An electronic apparatus, comprising:

a lens configured to receive and focus light; and an imaging device, comprising:

a semiconductor substrate having an effective pixel region including a first plurality of photoelectric conversion elements configured to receive the light;

an optical black region including a second plurality of photoelectric conversion elements, a first groove portion provided between adjacent photoelectric conversion elements in the effective pixel region, a second groove portion provided in the optical black region; and a third groove portion provided between the first groove portion and the second groove portion;

an insulating material disposed, at least in part, in the first groove portion;

a metallic oxide disposed, at least in part, in the first groove portion and the third groove portion, wherein the metallic oxide extends from the first groove portion to the third groove portion along a surface of the semiconductor substrate; and a peripheral circuit configured to perform analog-to-digital conversion.

* * * * *